United States Patent
Lee et al.

(10) Patent No.: US 10,572,041 B2
(45) Date of Patent: *Feb. 25, 2020

(54) TOUCH PRESSURE DETECTABLE TOUCH INPUT DEVICE

(71) Applicant: HiDeep Inc., Seongnam-si, Gyeonggi-do (KR)

(72) Inventors: Won Woo Lee, Gyeonggi-do (KR); Bonkee Kim, Gyeonggi-do (KR); Seyeob Kim, Gyeonggi-do (KR); Young ho Cho, Gyeonggi-do (KR)

(73) Assignee: HIDEEP INC., Gyeonggi-do (KR)

( * ) Notice: Subject to any disclaimer, the term of this patent is extended or adjusted under 35 U.S.C. 154(b) by 148 days.

This patent is subject to a terminal disclaimer.

(21) Appl. No.: 15/466,238

(22) Filed: Mar. 22, 2017

(65) Prior Publication Data

US 2017/0277317 A1    Sep. 28, 2017

(30) Foreign Application Priority Data

Mar. 24, 2016    (KR) .......................... 10-2016-0035140

(51) Int. Cl.
    *G06F 3/041*        (2006.01)
    *G02F 1/1333*       (2006.01)
    *G06F 3/044*        (2006.01)
    *H01L 27/32*        (2006.01)

(52) U.S. Cl.
    CPC ........ *G06F 3/0412* (2013.01); *G02F 1/13338* (2013.01); *G06F 3/044* (2013.01); *H01L 27/323* (2013.01); *G06F 2203/04105* (2013.01)

(58) Field of Classification Search
    CPC .......... G06F 3/044; G06F 3/041; G06F 3/048; G06F 3/0484; G06F 3/1454; G06F 3/4445; G02F 1/1333; H05K 1/02
    USPC .......................... 345/173, 174, 1.3, 156, 650
    See application file for complete search history.

(56) References Cited

U.S. PATENT DOCUMENTS

| 10,318,040 B2 * | 6/2019 | Kim .................... G02F 1/13338 |
| 2006/0290686 A1 | 12/2006 | Shimizu et al. |
| 2011/0303441 A1 | 12/2011 | Kobayashi et al. |

(Continued)

FOREIGN PATENT DOCUMENTS

| CN | 105278792 A | 1/2016 |
| CN | 105302398 A | 2/2016 |

(Continued)

OTHER PUBLICATIONS

Office Action dated Jan. 23, 2018 in related Japanese Appl. 2017-048214 (2 pgs.).

(Continued)

*Primary Examiner* — Calvin C Ma
(74) *Attorney, Agent, or Firm* — Foley & Lardner LLP

(57) ABSTRACT

A touch input device may be provided that includes: a mid-frame; a cover disposed on the mid-frame; a display module disposed between the mid-frame and the cover; and a sensor which is disposed between the mid-frame and the cover and detects at least any one of a touch and a pressure. The mid-frame includes a base plate which includes a top surface and a bottom surface. The mid-frame includes a reinforcing member which is disposed on the top surface of the base plate and is configured to reinforce a strength of the base plate.

27 Claims, 21 Drawing Sheets

(56) References Cited

U.S. PATENT DOCUMENTS

| | | | | |
|---|---|---|---|---|
| 2014/0085213 A1* | 3/2014 | Huppi | ............. | G06F 3/0414 |
| | | | | 345/173 |
| 2014/0085247 A1* | 3/2014 | Leung | ............. | G06F 3/0414 |
| | | | | 345/174 |
| 2014/0327624 A1* | 11/2014 | Srinivas | ............. | G06F 1/1626 |
| | | | | 345/173 |
| 2016/0098131 A1* | 4/2016 | Ogata | ............. | G06F 1/1643 |
| | | | | 345/173 |
| 2016/0299598 A1 | 10/2016 | Yoon et al. | | |
| 2017/0024049 A1 | 1/2017 | Tachikawa et al. | | |
| 2017/0031479 A1* | 2/2017 | Kim | ............. | G06F 3/044 |

FOREIGN PATENT DOCUMENTS

| | | |
|---|---|---|
| EP | 2 395 820 A1 | 12/2011 |
| JP | 2007-072555 A | 3/2007 |
| JP | 2009-146354 A | 7/2009 |
| JP | 2011-258836 A | 12/2011 |
| JP | 2015-106243 A | 6/2015 |
| JP | 2016-035736 A | 3/2016 |
| KR | 10-2015-0008956 A | 1/2015 |
| KR | 10-2015-0088601 A | 8/2015 |

OTHER PUBLICATIONS

Office Action dated Feb. 6, 2017 in related Korean Appl. 10-2015-0035140 (5 pgs.).
Extended European Search Report dated Aug. 21, 2017 in related European Appl. No. 17162372.1 (9 pgs.).
Office Action dated Jul. 2, 2019 in related Chinese Appl. 201710164743.6 (8 pgs.).

* cited by examiner

TOUCH PRESSURE DETECTABLE TOUCH INPUT DEVICE

CROSS REFERENCE TO RELATED APPLICATION

This application claims priority to South Korean Application No. 10-2016-0035140, filed Mar. 24, 2016, the disclosure of which is incorporated by reference herein in its entirety.

BACKGROUND

Field

The present disclosure relates to a touch input device which detects a touch pressure.

Description of the Related Art

Various kinds of input devices are being used to operate a computing system. For example, the input device includes a button, key, joystick and touch screen. Since the touch screen is easy and simple to operate, the touch screen is increasingly being used in operation of the computing system.

The touch screen may constitute a touch surface of a touch input device including a touch sensor panel which may be a transparent panel including a touch-sensitive surface. The touch sensor panel is attached to the front side of a display screen, and then the touch-sensitive surface may cover the visible side of the display screen. The touch screen allows a user to operate the computing system by simply touching the touch screen by a finger, etc. Generally, the computing system recognizes the touch and a position of the touch on the touch screen and analyzes the touch, and thus, performs the operations in accordance with the analysis.

Meanwhile, various types and shapes of display panels may be used in the touch screen. Therefore, the touch input device capable of efficiently detecting the touch position and touch pressure is increasingly required as the touch input device including the various types and shapes of display panels.

SUMMARY

One embodiment is a touch input device which includes: a mid-frame; a cover disposed on the mid-frame; a display module disposed between the mid-frame and the cover; and a sensor which is disposed between the mid-frame and the cover and detects at least any one of a touch and a pressure. The mid-frame includes a base plate which includes a top surface and a bottom surface. The mid-frame includes a reinforcing member which is disposed on the top surface of the base plate and is configured to reinforce a strength of the base plate.

Another embodiment is a touch input device which includes: a housing which receives a battery and a mainboard; a mid-frame which is disposed within the housing and is disposed on the battery and on the mainboard; a cover which is disposed on the mid-frame and on the housing; a display module which is disposed between the mid-frame and the cover; and a sensor which is disposed between the mid-frame and the cover and detects at least any one of a touch and a pressure. The mid-frame includes a base plate which includes a top surface and a bottom surface. The mid-frame includes a guide member which is disposed on the bottom surface of the base plate, is disposed between the battery and the mainboard, and is configured to reinforce a strength of the base plate.

DETAILED DESCRIPTION

Figure 1:
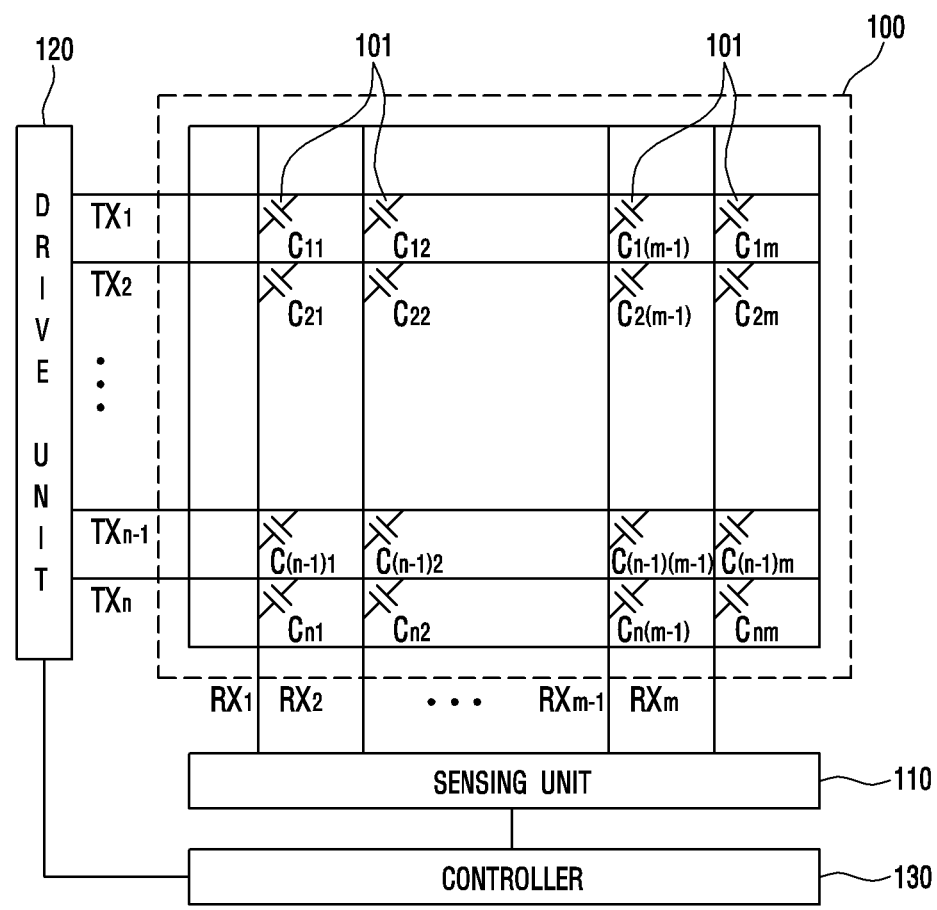
FIG. 1 is a view for describing a configuration and an operation of a touch sensor panel which is a component of a touch input device according to an embodiment of the present invention.

Specific embodiments of the present invention will be described in detail with reference to the accompanying drawings. The specific embodiments shown in the accompanying drawings will be described in enough detail that those skilled in the art are able to embody the present invention. Other embodiments other than the specific embodiments are mutually different, but do not have to be mutually exclusive. Additionally, it should be understood that the following detailed description is not intended to be limited.

The detailed descriptions of the specific embodiments shown in the accompanying drawings are intended to be read in connection with the accompanying drawings, which are to be considered part of the entire written description. Any reference to direction or orientation is merely intended for convenience of description and is not intended in any way to limit the scope of the present invention.

Specifically, relative terms such as "lower," "upper," "horizontal," "vertical," "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description only and do not require that the apparatus be constructed or operated in a particular orientation.

In description of embodiments of the present invention, when it is mentioned that an element is formed "on" or "under" another element, it means that the mention includes a case where two elements are formed directly contacting with each other or are formed such that at least one separate element is interposed between the two elements. The "on" and "under" will be described to include the upward and downward directions based on one element.

Terms such as "attached," "affixed," "connected," "coupled," "interconnected," and similar refer to a relationship wherein structures are attached, connected or fixed to one another either directly or indirectly through intervening structures, as well as both movable or rigid attachments or relationships, unless expressly described otherwise.

Hereinafter, a touch input device according to an embodiment of the present invention will be described in detail with reference to the accompanying drawings.

The touch input device according to the embodiment of the present invention, which includes a display module and is capable of detecting a pressure, can be used not only in a portable electronic product such as a smartphone, smartwatch, tablet PC, laptop computer, personal digital assistant (PDA), MP3 player, camera, camcorder, electronic dictionary, etc., but also in an electric home appliance such as a home PC, TV, DVD, refrigerator, air conditioner, microwave, etc. Also, the touch pressure detectable touch input device including a display module in accordance with the embodiment of the present invention can be used without limitation in all of the products requiring a device for display and input such as an industrial control device, a medical device, etc.

FIG. 1 is a view for describing a configuration and an operation of a capacitance type touch sensor panel 100 included in the touch input device according to the embodiment of the present. Referring to FIG. 1, the touch sensor panel 100 may include a plurality of drive electrodes TX1 to TXn and a plurality of receiving electrodes RX1 to RXm, and may include a drive unit 120 which applies a drive signal to the plurality of drive electrodes TX1 to TXn for the purpose of the operation of the touch sensor panel 100, and a sensing unit 110 which detects the touch and the touch position by receiving a sensing signal including information on a capacitance change amount changing according to the touch on the touch surface of the touch sensor panel 100.

As shown in FIG. 1, the touch sensor panel 100 may include the plurality of drive electrodes TX1 to TXn and the plurality of receiving electrodes RX1 to RXm. FIG. 1 shows that the plurality of drive electrodes TX1 to TXn and the plurality of receiving electrodes RX1 to RXm of the touch sensor panel 100 form an orthogonal array. However, the present invention is not limited to this. The plurality of drive electrodes TX1 to TXn and the plurality of receiving electrodes RX1 to RXm have an array of arbitrary dimension, for example, a diagonal array, a concentric array, a 3-dimensional random array, etc., and an array obtained by the application of them. Here, "n" and "m" are positive integers and may be the same as each other or may have different values. The magnitude of the value may be changed depending on the embodiment.

As shown in FIG. 1, the plurality of drive electrodes TX1 to TXn and the plurality of receiving electrodes RX1 to RXm may be arranged to cross each other. The drive electrode TX may include the plurality of drive electrodes TX1 to TXn extending in a first axial direction. The receiving electrode RX may include the plurality of receiving electrodes RX1 to RXm extending in a second axial direction crossing the first axial direction.

In the touch sensor panel 100 according to the embodiment of the present invention, the plurality of drive electrodes TX1 to TXn and the plurality of receiving electrodes RX1 to RXm may be formed in the same layer. For example, the plurality of drive electrodes TX1 to TXn and the plurality of receiving electrodes RX1 to RXm may be formed on the same side of an insulation layer (not shown). Also, the plurality of drive electrodes TX1 to TXn and the plurality of receiving electrodes RX1 to RXm may be formed in the different layers. For example, the plurality of drive electrodes TX1 to TXn and the plurality of receiving electrodes RX1 to RXm may be formed on both sides of one insulation layer (not shown) respectively, or the plurality of drive electrodes TX1 to TXn may be formed on a side of a first insulation layer (not shown) and the plurality of receiving electrodes RX1 to RXm may be formed on a side of a second insulation layer (not shown) different from the first insulation layer.

The plurality of drive electrodes TX1 to TXn and the plurality of receiving electrodes RX1 to RXm may be made of a transparent conductive material (for example, indium tin oxide (ITO) or antimony tin oxide (ATO) which is made of tin oxide ($SnO_2$), and indium oxide ($In_2O_3$), etc.), or the like. However, this is only an example. The drive electrode TX and the receiving electrode RX may be also made of another transparent conductive material or an opaque conductive material. For instance, the drive electrode TX and the receiving electrode RX may be formed to include at least any one of silver ink, copper, nano silver, or carbon nanotube (CNT). Also, the drive electrode TX and the receiving electrode RX may be made of metal mesh.

The drive unit 120 according to the embodiment may apply a drive signal to the drive electrodes TX1 to TXn. In the embodiment, one drive signal may be sequentially applied at a time to the first drive electrode TX1 to the n-th drive electrode TXn. The drive signal may be applied again repeatedly. This is only an example. The drive signal may be applied to the plurality of drive electrodes at the same time in accordance with the embodiment.

Through the receiving electrodes RX1 to RXm, the sensing unit 110 receives the sensing signal including information on a capacitance (Cm) 101 generated between the receiving electrodes RX1 to RXm and the drive electrodes TX1 to TXn to which the drive signal has been applied, thereby detecting whether or not the touch has occurred and where the touch has occurred. For example, the sensing signal may be a signal coupled by the capacitance (CM) 101 generated between the receiving electrode RX and the drive electrode TX to which the drive signal has been applied. As such, the process of sensing the drive signal applied from the first drive electrode TX1 to the n-th drive electrode TXn through the receiving electrodes RX1 to RXm can be referred to as a process of scanning the touch sensor panel 100.

For example, the sensing unit 110 may include a receiver (not shown) which is connected to each of the receiving electrodes RX1 to RXm through a switch. The switch becomes the on-state in a time interval during which the signal of the corresponding receiving electrode RX is detected, thereby allowing the receiver to detect the sensing signal from the receiving electrode RX. The receiver may include an amplifier (not shown) and a feedback capacitor coupled between the negative (−) input terminal of the amplifier and the output terminal of the amplifier, i.e., coupled to a feedback path. Here, the positive (+) input terminal of the amplifier may be connected to the ground. Also, the receiver may further include a reset switch which is connected in parallel with the feedback capacitor. The reset switch may reset the conversion from current to voltage that is performed by the receiver. The negative input terminal of the amplifier is connected to the corresponding receiving electrode RX and receives and integrates a current signal including information on the capacitance (CM) 101, and then converts the integrated current signal into voltage. The sensing unit 110 may further include an analog to digital converter (ADC) (not shown) which converts the integrated data by the receiver into digital data. Later, the digital data may be input to a processor (not shown) and processed to obtain information on the touch on the touch sensor panel 100. The sensing unit 110 may include the ADC and processor as well as the receiver.

A controller 130 may perform a function of controlling the operations of the drive unit 120 and the sensing unit 110. For example, the controller 130 generates and transmits a drive control signal to the drive unit 120, so that the drive signal can be applied to a predetermined drive electrode TX1 for a predetermined time period. Also, the controller 130 generates and transmits the drive control signal to the sensing unit 110, so that the sensing unit 110 may receive the sensing signal from the predetermined receiving electrode RX for a predetermined time period and perform a predetermined function.

In FIG. 1, the drive unit 120 and the sensing unit 110 may constitute a touch detection device (not shown) capable of detecting whether the touch has occurred on the touch sensor panel 100 or not and where the touch has occurred. The touch detection device may further include the controller 130. The touch detection device may be integrated and implemented on a touch sensing integrated circuit IC in a touch input device 1000 including the touch sensor panel 100. The drive electrode TX and the receiving electrode RX included in the touch sensor panel 100 may be connected to the drive unit 120 and the sensing unit 110 included in touch sensing IC 150 through, for example, a conductive trace and/or a conductive pattern printed on a circuit board, or the like. The touch sensing IC 150 may be placed on a circuit board on which the conductive pattern has been printed, for example, a first printed circuit board (hereafter, referred to as a first PCB). According to the embodiment, the touch sensing IC 150 may be mounted on a main board for operation of the touch input device 1000.

As described above, a capacitance (C) with a predetermined value is formed at each crossing of the drive electrode TX and the receiving electrode RX. When an object such as a finger approaches close to the touch sensor panel 100, the value of the capacitance may be changed. In FIG. 1, the capacitance may represent a mutual capacitance (Cm). The sensing unit 110 detects such electrical characteristics, thereby detecting whether the touch has occurred on the touch sensor panel 100 or not and where the touch has occurred. For example, the sensing unit 110 is able to detect whether the touch has occurred on the surface of the touch sensor panel 100 comprised of a two-dimensional plane consisting of a first axis and a second axis.

More specifically, when the touch occurs on the touch sensor panel 100, the drive electrode TX to which the drive signal has been applied is detected, so that the position of the second axial direction of the touch can be detected. Likewise, when the touch occurs on the touch sensor panel 100, the capacitance change is detected from the reception signal received through the receiving electrode RX, so that the position of the first axial direction of the touch can be detected.

The foregoing has described in detail the mutual capacitance type touch sensor panel as the touch sensor panel 100. However, in the touch input device 1000 according to the embodiment of the present invention, the touch sensor panel 100 for detecting whether or not the touch has occurred and the touch position may be implemented by using not only the above-described method but also any touch sensing method such as a self-capacitance type method, a surface capacitance type method, a projected capacitance type method, a resistance film method, a surface acoustic wave (SAW) method, an infrared method, an optical imaging method, a dispersive signal technology, and an acoustic pulse recognition method, etc.

In the touch input device 1000 to which a pressure sensor according to the embodiment can be applied, the touch sensor panel 100 for detecting the touch position may be positioned outside or inside the display module 200.

The display module included in the display module 200 of the touch input device 1000 to which the pressure sensor according to the embodiment can be applied may be an organic light emitting diode (OLED). The OLED may be an AM-OLED or PM-OLED.

However, the display module 200 of the touch input device 1000 according to the embodiment is not limited to this. The display module 200 may be another type of module capable of displaying such as liquid crystal display (LCD), a plasma display panel (PDP), etc.

Accordingly, a user may perform the input operation by touching the touch surface while visually identifying an image displayed on the display module. Here, the display module 200 may include a control circuit which receives an input from an application processor (AP) or a central processing unit (CPU) on a main board for the operation of the touch input device 1000 and displays the contents that the user wants on the display module. This control circuit may be mounted on a second printed circuit board (not shown). Here, the control circuit for the operation of the display module may include a display module control IC, a graphic controller IC, and other circuits required to operate the display module.

Following the above description of the operation of the touch sensor panel 100 which detects the touch position, a method and principle of detecting the touch pressure will be described with reference to FIGS. 2 to 3.

Figure 2:
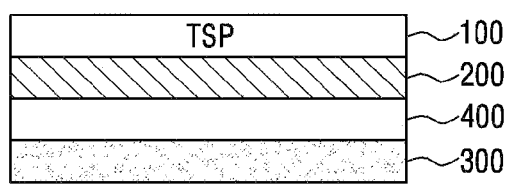
FIG. 2 shows a configuration of the touch input device according to the embodiment of the present invention.

FIG. 2 shows a configuration of the touch input device 1000 according to the embodiment of the present invention. FIG. 3 shows a touch pressure detection method and various embodiments of a pressure sensor 400 for the same.

As shown in FIG. 2, the touch input device 1000 according to the embodiment of the present invention includes the touch sensor panel 100, the display module 200, the pressure sensor 400, and a mid-frame 300. Here, the mid-frame 300 may be a reference potential layer. The reference potential layer of the touch input device 1000 according to another embodiment of the present invention may be arranged differently from the arrangement of FIG. 2. That is, the reference potential layer may be located on the pressure sensor 400 or may be located within the display module 200. Also, one or more reference potential layers may be provided. Here, the pressure sensor 400 may be disposed differently in response to the stack structure of the touch input device 1000. This will be described in detail in the description of the embodiment of FIG. 3.

Figure 3:
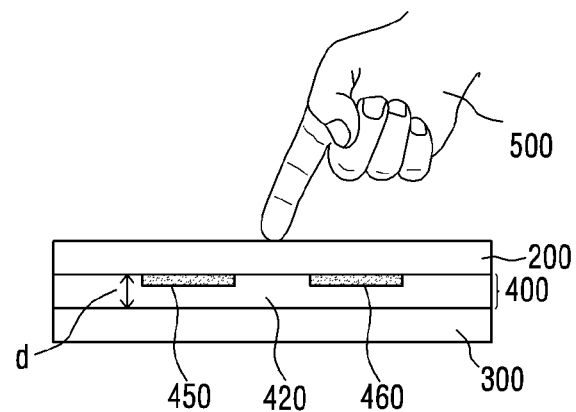
FIG. 3 is a view for describing a touch pressure detection method and shows a configuration of a pressure sensor according to the embodiment of the present invention.

FIG. 3 shows specifically the electrode arrangement of the pressure sensor 400 of the touch input device 1000 according to the embodiment of the present invention. In the electrode arrangement shown in FIG. 3, the pressure electrodes 450 and 460 may be located between the display module 200 and the mid-frame 300 and may be disposed closer to the display module 200. Specifically, the pressure electrodes 450 and 460 may be disposed on the bottom surface of the display module 200.

However, unlike the embodiment of FIG. 3, it can be also considered that the pressure electrodes 450 and 460 are formed on the lower surface of the display module 200. Here, the lower surface of the display module 200 may be the bottom surface of the display module 200 or may be any one surface of the lower portion of the display module 200.

The mid-frame 300 is the reference potential layer and may have a ground potential. Therefore, a distance "d" between the mid-frame 300 and the pressure electrodes 450 and 460 is reduced by the touch on the touch surface of the touch sensor panel 100. This causes the change of the mutual capacitance between the first electrode 450 and the second electrode 460.

When an object 500 applies a pressure to the surface of the touch sensor panel 100 shown in FIG. 2, the touch sensor panel 100 and the display module 200 shown in FIG. 2 may be bent. Accordingly, the distance "d" between the mid-frame 300 and the first electrode 450 and between the mid-frame 300 and the second electrode 460. In this case, due to the reduction of the distance "d", the mutual capacitance between the first electrode 450 and the second electrode 460 may be reduced. Thus, the reduced amount of the mutual capacitance is detected from the sensing signal obtained through the receiving electrode, so that the magnitude of the touch pressure can be calculated.

FIGS. 4a to 4f show structural cross sections of the pressure sensor 400 of the touch input device 1000 according to various embodiment of the present invention.

Figure 4A:
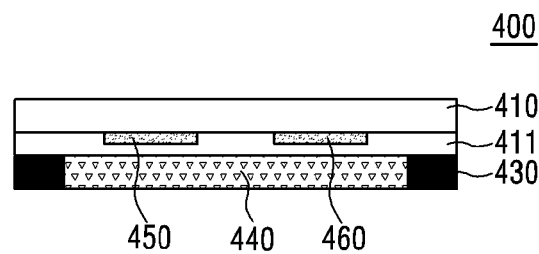
FIGS. 4a to 4f are cross sectional views of the pressure sensor of the touch input device according to various embodiment of the present invention.

As shown in FIG. 4a, in the pressure electrode module 400, the pressure electrodes 450 and 460 are located between a first insulation layer 410 and a second insulation layer 411. For example, the pressure electrodes 450 and 460 may be formed on the first insulation layer 410, and then may be covered with the second insulation layer 411. Here, the first insulation layer 410 and the second insulation layer 411 may be made of an insulating material such as a polyimide. The first insulation layer 410 may be polyethylene terephthalate (PET) and the second insulation layer 411 may be a cover layer made of ink. The pressure electrodes 450 and 460 may include a material such as copper or aluminum. According to the embodiment, by a bond (not shown) such as a liquid bond, the first insulation layer 410 and the second insulation layer 411 may be bonded to each other, and the first insulation layer 410 and the pressure electrodes 450 and 460 may be bonded to each other. Also, according to the embodiment, the pressure electrodes 450 and 460 may be formed by positioning a mask, which has a through-hole corresponding to a pressure electrode pattern, on the first insulation layer 470, and then by spraying a conductive material. Also, the pressure electrodes 450 and 460 may be printed on the first insulation layer 410 by a gravure printing method using a roller.

In FIG. 4a, the pressure sensor 400 may further include an elastic foam 440. The elastic foam 440 may be formed on a side of the second insulation layer 411 in such a manner as to be opposite to the first insulation layer 410. Later, when the pressure sensor 400 is disposed on the mid-frame 300, the elastic foam 440 may be disposed on the mid-frame 300 side with respect to the second insulation layer 411.

Here, in order to attach the pressure sensor 400 to the mid-frame 300, an adhesive tape 430 having a predetermined thickness may be formed on the outskirt of the elastic foam 440. According to the embodiment, the adhesive tape 430 may be a double adhesive tape. Here, the adhesive tape 430 may also function to adhere the elastic foam 440 to the second insulation layer 411. Here, the adhesive tape 430 is disposed on the outskirt of the elastic foam 440, so that the thickness of the pressure sensor 400 can be effectively reduced.

When the pressure sensor 400 shown in FIG. 4a is disposed on the mid-frame 300, the pressure electrodes 450 and 460 may operate to detect the pressure. For instance, the pressure electrodes 450 and 460 is disposed on the display module 200 side. The reference potential layer may correspond to the mid-frame 300, and the elastic foam 440 may perform operations corresponding to the spacer layer 420. For example, when the top of the touch input device 1000 is touched, the elastic foam 440 is pressed and the distance between the mid-frame 300, i.e., the reference potential layer and the pressure electrodes 450 and 460 is reduced. As a result, the mutual capacitance between the first electrode 405 and the second electrode 460 may be reduced. Through such a change of the capacitance, the magnitude of the touch pressure can be detected.

Figure 4B:
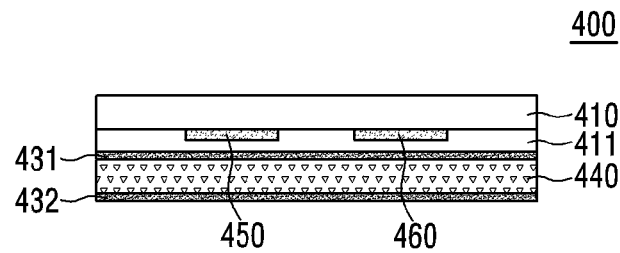

Unlike FIG. 4a, the pressure sensor 400 may not be attached to the mid-frame 300 through the adhesive tape 430 disposed on the outskirt of the elastic foam 440. In FIG. 4b, a first adhesive tape 431 for adhering the elastic foam 440 to the second insulation layer 411 and a second adhesive tape 432 for adhering the pressure sensor 400 to the mid-frame 300 are included on the elastic foam 440. As such, the first adhesive tape 431 and the second adhesive tape 432 are disposed, so that the elastic foam 440 can be securely attached to the second insulation layer 411 and the pressure sensor 400 can be securely attached to the mid-frame 300. According to the embodiment, the pressure sensor 400 shown in FIG. 4b may not include the second insulation layer 411. For example, the first adhesive tape 431 may not only function as a cover layer covering directly the pressure electrodes 450 and 460 but also function to attach the elastic foam 440 to the first insulation layer 410 and the pressure electrodes 450 and 460. This can be applied to the following FIGS. 4c to 4f.

Figure 4C:
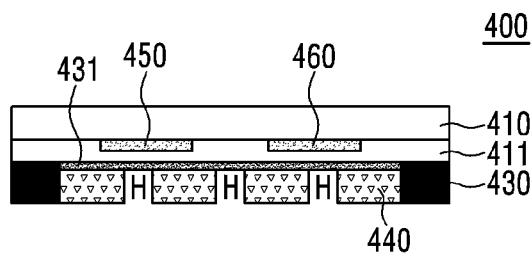

FIG. 4c shows a modified example of the structure shown in FIG. 4a. In FIG. 4c, a hole "H" extending through the elastic foam 440 is formed in the elastic foam 440, thereby causing the elastic foam 440 to be well pressed by the touch on the touch input device 1000. The hole "H" may be filled with air. When the elastic foam 440 is well pressed, the sensitivity for the pressure detection can be improved. Also, the hole "H" formed in the elastic foam 440 makes it possible to prevent the surface of the elastic foam 440 from protruding due to the air at the time of attaching the pressure sensor 400 to the mid-frame 300, etc. In FIG. 4c, for the purpose of securely attaching the elastic foam 440 to the second insulation layer 411, the first adhesive tape 431 as well as the adhesive tape 430 may be further included.

Figure 4D:
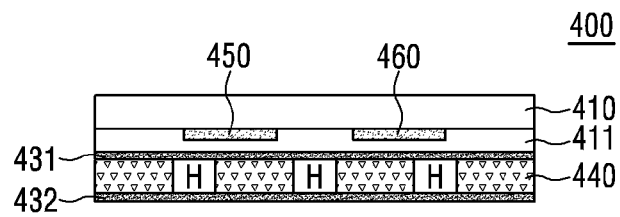

FIG. 4d shows a modified example of the structure shown in FIG. 4b. As with FIG. 4c, the hole "H" extending through the height of the elastic foam 440 is formed in the elastic foam 440.

Figure 4E:
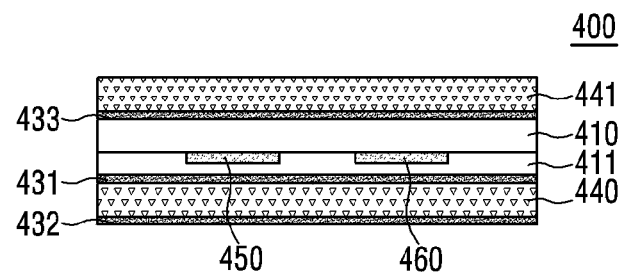

FIG. 4e shows a modified example of the structure shown in FIG. 4b. A second elastic foam 441 may be further included on one side of the first insulation layer 410, that is, the opposite side to the elastic foam 440. The second elastic foam 441 may be further formed in order to minimize the impact transmitted to the display module 200 when the pressure sensor 400 is later attached to the touch input device 1000. Here, a third adhesive layer 433 for adhering the second elastic foam 441 to the first insulation layer 410 may be further included.

Figure 4F:
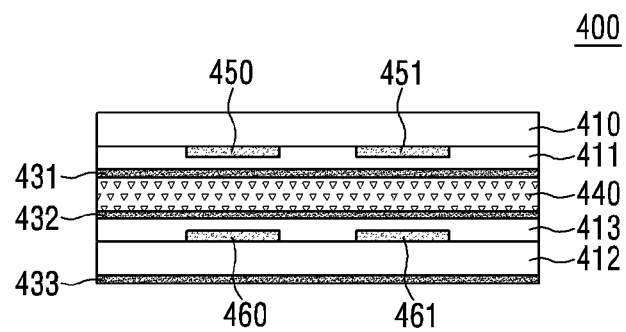

FIG. 4f shows a structure of the pressure sensor 400 capable of operating to detect the pressure. FIG. 4f shows the structure of the pressure sensor 400, in which the first electrodes 450 and 451 and the second electrodes 460 and 461 are disposed with the elastic foam 440 placed therebetween. Similarly to the structure described with reference to FIG. 4b, the first electrodes 450 and 451 may be formed between the first insulation layer 410 and the second insulation layer 411, and the first adhesive tape 431, the elastic foam 440, and the second adhesive tape 432 may be formed. The second electrodes 460 and 461 may be formed between a third insulation layer 412 and a fourth insulation layer 413, and the fourth insulation layer 413 may be attached to one side of the elastic foam 440 by means of the second adhesive tape 432. Here, the third adhesive tape 433 may be formed on the substrate-side surface of the third insulation layer 412. The pressure sensor 400 may be attached to the mid-frame 300 by means of the third adhesive tape 433. As described with reference to FIG. 4b, according to the embodiment, the pressure sensor 400 shown in FIG. 4f may not include the second insulation layer 411 and/or the fourth insulation layer 413. For example, the first adhesive tape 431 may not only function as a cover layer covering directly the first electrodes 450 and 451 but also function to attach the elastic foam 440 to the first insulation layer 410 and the first electrodes 450 and 451. Also, the second adhesive tape 432 may not only function as a cover layer covering directly the second electrodes 460 and 461 but also function to attach the elastic foam 440 to the third insulation layer 412 and the second electrodes 460 and 461.

Here, the elastic foam 440 is pressed by the touch on the touch input device 1000, and thus, the mutual capacitance between the first electrodes 450 and 451 and the second electrodes 460 and 461. Through such a change of the capacitance, the touch pressure can be detected. Also, according to the embodiment, any one of the first electrodes 450 and 451 and the second electrodes 460 and 461 is maintained at the ground potential, and then the self-capacitance can be detected by the other electrode.

In FIG. 4f, although the thickness and manufacturing cost of the pressure sensor 400 are higher than those of a case where the electrode is formed as a single layer, it is ensured that a pressure detection performance is not changed according to the characteristics of the reference potential layer located outside the pressure sensor 400. That is, the pressure sensor 400 is formed as shown in FIG. 4f, an effect caused by an external potential (ground) environment can be minimized in the pressure detection. Therefore, regardless of the type of the touch input device 1000 to which the pressure sensor 400 is applied, the same pressure sensor 400 can be used.

In the foregoing, the pressure detection based on the mutual capacitance change amount which changes as the drive electrode and the receiving electrode become close to the reference potential layer has been described by using the pressure electrode including the drive electrode and the receiving electrode. However, the pressure sensor 400 according to the embodiment of the present invention is able to detect the touch pressure on the basis of the self-capacitance change amount.

Briefly describing, the touch pressure can be detected by using self-capacitance formed between the pressure electrode (the drive electrode or the receiving electrode may be used as the pressure electrode) and the reference potential layer. In other words, the touch pressure can be detected by using self-capacitance which is formed between the drive electrode and the reference potential layer and/or between the receiving electrode and the reference potential layer. When the touch pressure is not applied even by user's touch, the distance between the pressure electrode and the reference potential layer is not changed, so that the value of the self-capacitance is not changed. In this case, only the touch position by the touch sensor panel 100 would be detected. However, when even the touch pressure is applied, the value of the self-capacitance is changed in the above manner, and the pressure sensor 400 detects the touch pressure on the basis of the change amount of the self-capacitance.

Specifically, when the pressure is applied by the touch, the reference potential layer or the pressure electrode (the drive electrode or the receiving electrode may be used as the pressure electrode) moves, so that the distance between the reference potential layer and the pressure electrode is reduced and the value of the self-capacitance is increased. On the basis of the increased value of the self-capacitance, the touch pressure is detected by determining the magnitude of the touch pressure.

Figure 5A:
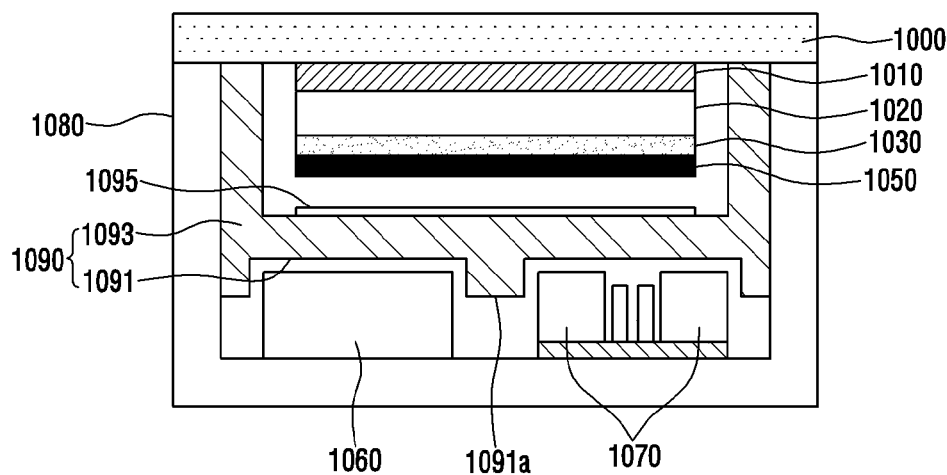
FIGS. 5a and 5b are cross sectional views of the touch input device according to another embodiment of the present invention.

FIG. 5a is a cross sectional view of the touch input device according to another embodiment of the present invention.

Not only a mid-frame 1090 within which display modules 1010 and 1020 and a pressure sensor 1050 are mounted but also a battery 1060 supplying a driving electric power and a mainboard 1070 on which various components necessary for driving the device are mounted may be included within a housing 1080 of the touch input device.

In FIG. 5a, the mid-frame 1090 is spaced apart from the display modules 1010 and 1020 by a predetermined interval. An air-gap may be formed in the interval. However, there is no limitation to this. A predetermined cushion may be disposed in the interval. FIG. 5a shows that the display modules 1010 and 1020 are LCDs. The display modules 1010 and 1020 include the LCD module 1010 and the backlight unit 1020 and are received within the mid-frame 1090. Meanwhile, a cover 1000 may be formed on the display surface of the display modules 1010 and 1020.

The pressure sensor 1050 is provided under the backlight unit 1020.

Although FIG. 5a shows that a metal cover 1030 is disposed between the backlight unit 1020 and the pressure sensor 1050, the metal cover 1030 may be omitted in another embodiment. Here, the metal cover 1030 may be designated as a steel use stainless (SUS).

The metal cover 1030 may function to firmly fix or protect the display modules 1010 and 1020 and may function to shield electromagnetic waves. Therefore, it is desirable that the metal cover 1030 should be made of a metallic material having a predetermined rigidity capable of blocking an external impact.

The detailed configuration of the pressure sensor 1050 disposed under the display modules 1010 and 1020 is the same as that described above, the detailed description thereof will be omitted herein. The pressure electrode included in the pressure sensor 1050 is used to detect the capacitance change amount depending on the change of the distance between the pressure electrode and the reference potential layer. In the embodiment of FIG. 5a, the mid-frame 1090 disposed under the pressure sensor 1050 is used as the reference potential layer.

The mid-frame 1090 is spaced apart from the pressure sensor 1050 by a predetermined interval. When the distance between the pressure sensor 1050 and the mid-frame 1090 is reduced by the pressure applied by the touch of the object, the capacitance (self-capacitance or mutual capacitance) is changed and then the magnitude of the touch pressure can be detected on the basis of the change amount.

By reinforcing the strength of the mid-frame 1090, it is possible to constantly maintain the pressure sensitivity even when an external force is applied to the touch input device. For example, when the user drops a smartphone, a tablet, or a phablet in which the touch input device is built and thus a predetermined external force is applied to the touch input device, the mid-frame 1090 may be deformed. Then, the distance between the mid-frame 1090, i.e., the reference potential layer and the pressure electrode included in the pressure sensor 1050 may become different from an initial distance at the time of release thereof. The pressure sensitivity has been set to be constant through the initial calibration regardless of a position. Here, if the distance is changed, the pressure sensitivity at a particular position may become different from the pressure sensitivity at another position. The change of the pressure sensitivity due to the external force can be reduced or prevented by reinforcing the strength of the mid-frame 1090. The detailed structure of the mid-frame 1090 will be described in detail below.

The mid-frame 1090 includes a base plate 1091. The base plate 1091 includes a top surface and a bottom surface thereof.

The pressure sensor 1050 is disposed above the top surface of the base plate 1091. The top surface of the base plate 1091 is spaced apart from the pressure sensor 1050 by a predetermined interval. The base plate 1091 may be used as the reference potential layer of the pressure electrode included in the pressure sensor 1050.

A reinforcing member 1095 may be disposed on the top surface of the base plate 1091. The reinforcing member 1095 may be integrally formed with the top surface of the base plate 1091 or may be attached to the top surface of the base plate 1091. The reinforcing member 1095 can reduce or prevent the deformation of the base plate 1091 which is caused by a predetermined force such as an external force by the user or external equipment, gravity, reaction by a momentary movement in a particular direction, etc. In other words, the reinforcing member 1095 reinforces the strength of the base plate 1091.

When the reinforcing member 1095 reinforces the strength of the base plate 1091, the pressure sensitivity of the touch input device can be constantly maintained. For example, in a case where the base plate 1091 is the reference potential layer of the pressure electrode included in the pressure sensor 1050, when the base plate 1091 is deformed by the external force, the distance between the pressure electrode and the base plate 1091 as the reference potential layer is changed, so that the pressure sensitivity may be changed according to the position. Therefore, by disposing the reinforcing member 1095 on the base plate 1091, it is possible to prevent the base plate 1091 from being deformed and to constantly maintain the pressure sensitivity of the touch input device.

The specific shape of the reinforcing member 1095 will be described later with reference to FIGS. 10 to 12.

The battery 1060 and the mainboard 1070 are disposed under the bottom surface of the base plate 1091. A guide member 1091a which guides the battery 1060 and the mainboard 1070 may be disposed on the bottom surface of the base plate 1091. The guide member 1091a may be integrally formed with the bottom surface of the base plate 1091 or may be attached to the bottom surface of the base plate 1091. The guide member 1091a, together with the bottom surface of the base plate 1091, may form a space for receiving the battery 1060 and the mainboard 1070. Since the movements of the battery 1060 and the mainboard 1070 are limited by the guide member 1091a, it is possible to prevent the battery 1060 and the mainboard 1070 from deviating from their regular positions. Also, the guide member 1091a can reduce the bending of the base plate 1091 which is caused by a predetermined force such as an external force by the user or external equipment, gravity, reaction by a momentary movement in a particular direction, etc. In other words, the guide member 1091a can reinforce the strength of the base plate 1091.

The mid-frame 1090 may include a side plate 1093 which extends upward from one end of the base plate 1091. The side plate 1093 may support the cover 1000. For this, the edge of the cover 1000 may be disposed on the side plate 1093. The side plate 1093 may include an inner surface and an outer surface. The inner surface of the side plate 1093 may be disposed apart from the sides of the display modules 1010 and 1020 and the pressure sensor 1050 by a predetermined interval. The outer surface of the side plate 1093 may be disposed to contact the inner surface of the housing 1080 or may be disposed apart from the inner surface of the housing 1080 by a predetermined interval.

The mainboard 1070 may receive or fix various components (e.g., IC, etc.) necessary for driving the device equipped with the touch input device and may be made of a metallic material and be connected to the ground (GND). However, the material of the mainboard 1070 is not limited to the metallic material. The mainboard 1070 may have a variety of shapes and sizes according to the received components. In particular, the mainboard 1070 functions to shield various components received therein, thereby blocking the introduction of the internal signal and emission of the external signal.

Figure 5B:
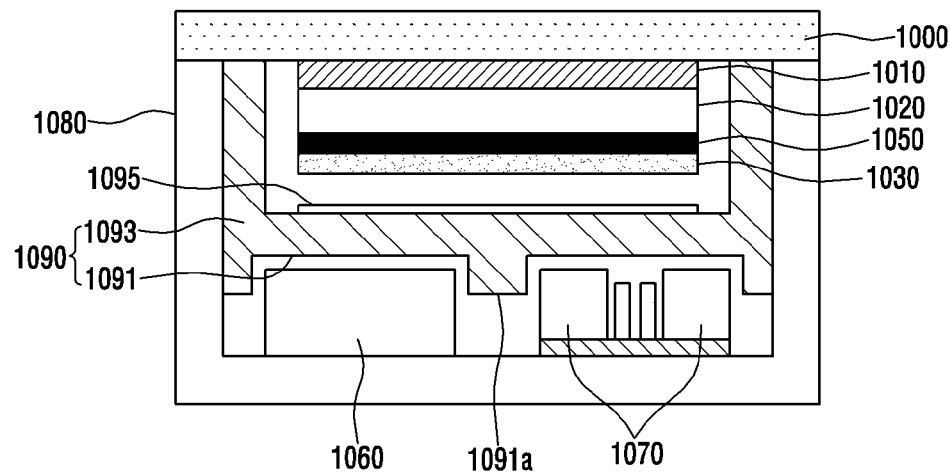

FIG. 5*b* is a cross sectional view of the touch input device according to further another embodiment of the present invention.

The configuration of the touch input device shown in FIG. 5*b* is the same as the configuration of the touch input device shown in FIG. 5*a*, except for the positions of the pressure sensor 1050 and the metal cover 1030.

The difference will be described in detail. While the touch input device shown in FIG. 5*a* shows that the metal cover 1030 is disposed between the pressure sensor 1050 and the display modules 1010 and 1020, the touch input device shown in FIG. 5*b* shows that the metal cover 1030 is disposed between the pressure sensor 1050 and the mid-frame 1090. Alternatively, in the touch input device shown in FIG. 5*b*, the pressure sensor 1050 is disposed between the metal cover 1030 and the display modules 1010 and 1020.

Here, though not shown in a separate figure, the display modules 1010 and 1020 may be disposed apart from the pressure sensor 1050 by a predetermined interval. Specifically, the bottom surface of the backlight unit 1020 and the top surface of the pressure sensor 1050 may be disposed apart from each other. In this case, the pressure sensor 1050 may be disposed on the top surface of the metal cover 1030.

In FIG. 5*b*, the mid-frame 1090 is spaced apart from the display modules 1010 and 1020 by a predetermined interval. An air-gap may be formed in the interval. However, there is no limitation to this. A predetermined cushion may be disposed in the interval.

The pressure electrode included in the pressure sensor 1050 is used to detect the capacitance change amount depending on the change of the distance between the reference potential layer and the pressure electrode. In the embodiment of the FIG. 5*b*, the reference potential layer is disposed within the display modules 1010 and 1020.

Figure 6:
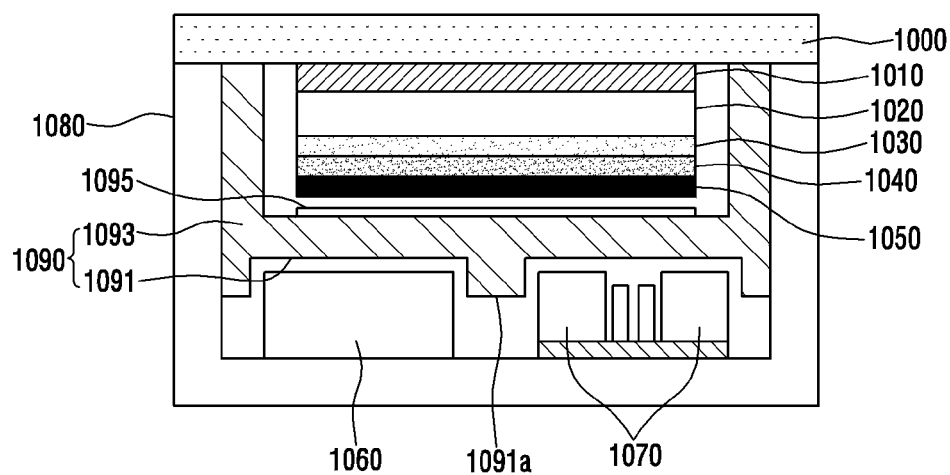
FIG. 6 is a cross sectional view of the touch input device according to further another embodiment of the present invention.

FIG. 6 is a cross sectional view of the touch input device according to further another embodiment of the present invention.

Compared to the touch input device shown in FIG. 5*a*, the touch input device shown in FIG. 6 further includes an elastic member 1040. The remaining components are the same as those of the touch input device shown in FIG. 5*a*.

The elastic member 1040 is disposed between the metal cover 1030 and the pressure sensor 1050.

The elastic member 1040 is located under the metal cover 1030. Such an elastic member 1040 absorbs the external impact and protects the components (particularly, the display module) within the touch input device. Therefore, it is desirable that the elastic member 1040 should be made of a material having an elasticity to absorb the impact. However, the metal cover 1030 and the elastic member 1040 may be omitted or may be replaced by another component having the same function as those of the metal cover 1030 and the elastic member 1040. Unlike FIG. 6, it can be considered that the positions of the metal cover 1030 and the elastic member 1040 are swapped. Also, the metal cover 1030 and the elastic member 1040 may be formed only on a portion of the lower area of the display module instead of the entire lower area of the display module. That is, the embodiment of the present invention is not limited to the positions, materials, and shapes of the metal cover 1030 and the elastic member 1040.

In FIG. 6, the mid-frame 1090 is spaced apart from the display modules 1010 and 1020 by a predetermined interval. An air-gap may be formed in the interval. However, there is no limitation to this. A predetermined cushion may be disposed in the interval.

The operation method is the same as that of the embodiment of FIG. 5*a*. That is, the touch pressure can be detected by using the mid-frame 1090 provided under the pressure sensor 1050 as the reference potential layer.

Figure 7:
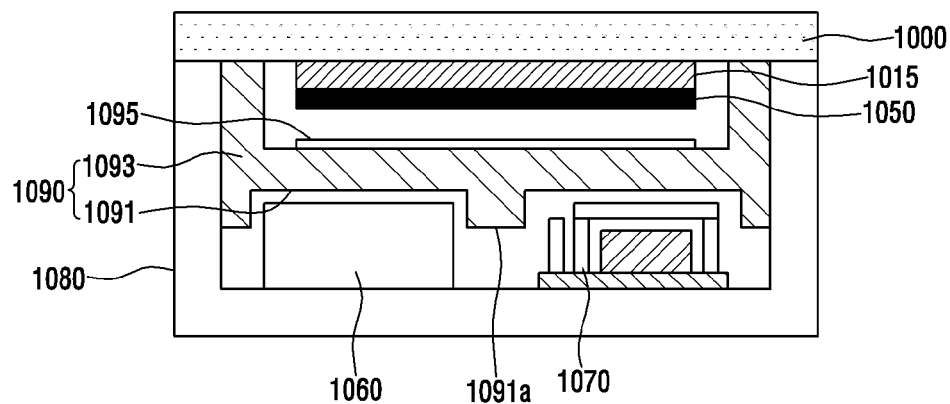
FIG. 7 is a cross sectional view of the touch input device according to yet another embodiment of the present invention.

FIG. 7 is a cross sectional view of the touch input device according to yet another embodiment of the present invention.

Referring to FIG. 7, a display module 1015 shown in FIG. 7 may include an OLED module, in particular an AM-OLED module. The remaining components are the same as those of the touch input device shown in FIG. 5*a*.

The OLED module is a self-light emitting display module using a principle in which when a current flows through a fluorescent or phosphorescent organic thin film and then electrons and electron holes are combined in an organic material layer, so that light is generated. The organic matter constituting the light emitting layer determines the color of the light.

Specifically, the OLED uses a principle in which when electricity flows and an organic matter is applied on glass or plastic, the organic matter emits light. That is, the principle is that electron holes and electrons are injected into the anode and cathode of the organic matter respectively and are recombined in the light emitting layer, so that a high energy exciton is generated and the exciton releases the energy while falling down to a low energy state and then light with a particular wavelength is generated. Here, the color of the light is changed according to the organic matter of the light emitting layer.

The OLED includes a line-driven passive-matrix organic light-emitting diode (PM-OLED) and an individual driven active-matrix organic light-emitting diode (AM-OLED) in accordance with the operating characteristics of a pixel constituting a pixel matrix. None of them require a backlight. Therefore, the OLED enables a very thin display module to be implemented, has a constant contrast ratio according to an angle and obtains a good color reproductivity depending on a temperature. Also, it is very economical in that non-driven pixel does not consume power.

In terms of operation, the PM-OLED emits light only during a scanning time at a high current, and the AM-OLED maintains a light emitting state only during a frame time at a low current. Therefore, the AM-OLED has a resolution higher than that of the PM-OLED and is advantageous for driving a large area display module and consumes low power. Also, a thin film transistor (TFT) is embedded in the AM-OLED, and thus, each component can be individually controlled, so that it is easy to implement a delicate screen.

In the embodiment of FIG. 7, the backlight unit is not present between the display module 1015 and the pressure sensor 1050.

In the embodiment of FIG. 7, the metal cover 1030 shown in FIG. 5*a* may be further disposed between the display module 1015 and the pressure sensor 1050.

In FIG. 7, the mid-frame 1090 is spaced apart from the display module 1015 by a predetermined interval. An air-gap may be formed in the interval. However, there is no limitation to this. A predetermined cushion may be disposed in the interval.

The operation method is the same as that of the embodiment of FIG. 5a. That is, the touch pressure can be detected by using the mid-frame 1090 provided under the pressure sensor 1050 as the reference potential layer.

Meanwhile, the metal cover 1030 shown in FIG. 5b may be further disposed under the pressure sensor 1050. In this case, the pressure sensor 1050 may be disposed apart from the display module 1015 by a predetermined interval, and the reference potential layer for detecting the pressure may be disposed within the OLED module 1015.

Figure 8:
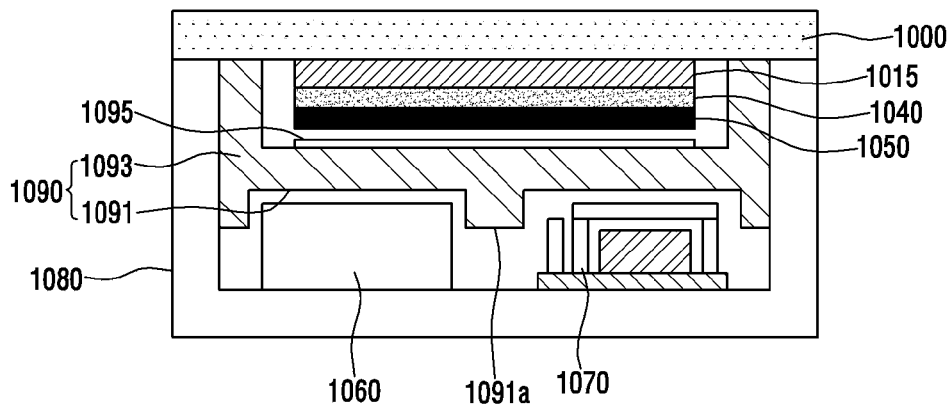
FIG. 8 is a cross sectional view of the touch input device according to still another embodiment of the present invention.

FIG. 8 is a cross sectional view of the touch input device according to still another embodiment of the present invention.

Compared to the touch input device shown in FIG. 7, the touch input device shown in FIG. 8 further includes the elastic member 1040. The remaining components are the same as those of the touch input device shown in FIG. 7.

Referring to FIG. 8, the elastic member 1040 is disposed between the OLED module 1015 and the pressure sensor 1050.

The elastic member 1040 is located under the OLED module 1015. Such an elastic member 1040 absorbs the external impact and protects the components (particularly, the display module) within the touch input device. Therefore, it is desirable that the elastic member 1040 should be made of a material having an elasticity to absorb the impact. However, the elastic member 1040 may be omitted or may be replaced by another component having the same function as that of the elastic member 1040. Also, the elastic member 1040 may be formed only on a portion of the lower area of the display module 1015 instead of the entire lower area of the display module 1015.

In the embodiment of FIG. 8, the metal cover 1030 shown in FIG. 6 may be further disposed between the OLED module 1015 and the elastic member 1040.

In FIG. 8, the mid-frame 1090 is spaced apart from the display module 1015 by a predetermined interval. An air-gap may be formed in the interval. However, there is no limitation to this. A predetermined cushion may be disposed in the interval.

The operation method is the same as that of the embodiment of FIG. 7. That is, the touch pressure can be detected by using the mid-frame 1090 provided under the pressure sensor 1050 as the reference potential layer.

Figure 9:
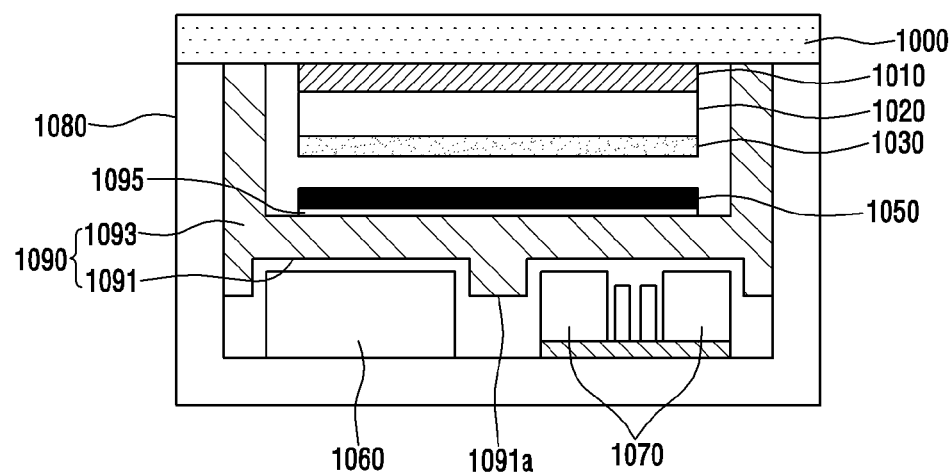
FIG. 9 is a cross sectional view of the touch input device according to still another embodiment of the present invention.

FIG. 9 is a cross sectional view of the touch input device according to still another embodiment of the present invention.

In the touch input device shown in FIG. 9 compared to the touch input device shown in FIG. 5a, the pressure sensor 1050 is disposed on the reinforcing member 1095 on the mid-frame 1090. That is, the pressure sensor 1050 is disposed on the top surface of the reinforcing member 1095 on the top surface of the mid-frame 1090. The remaining components are the same as those of the touch input device shown in FIG. 5a.

In FIG. 9, the mid-frame 1090 is spaced apart from the display modules 1010 and 1020 by a predetermined interval. An air-gap may be formed in the interval. However, there is no limitation to this. A predetermined cushion may be disposed in the interval.

The operation method may be different from that of the embodiment of FIG. 5a. Specifically, the touch pressure can be detected by using the reference potential layer (not shown) disposed on the top surface or the bottom surface of the display modules 1010 and 1020. The touch pressure can be detected by using the reference potential layer (not shown) disposed between the LCD module 1010 and the backlight unit 1020. The touch pressure can be detected by using the reference potential layer (not shown) disposed between two layers among a plurality of layers which are within the LCD module 1010 and constitute the LCD module 1010. For example, when the LCD module 1010 includes a first substrate (or a color filter layer), a liquid crystal layer disposed under the first substrate, and a second substrate (or a TFT layer) disposed under the liquid crystal layer, the reference potential layer (not shown) may be disposed between the first substrate and the liquid crystal layer or may be disposed between the liquid crystal layer and the second substrate. Also, the touch pressure may be detected by using the metal cover 1030 as the reference potential layer.

Figure 10:
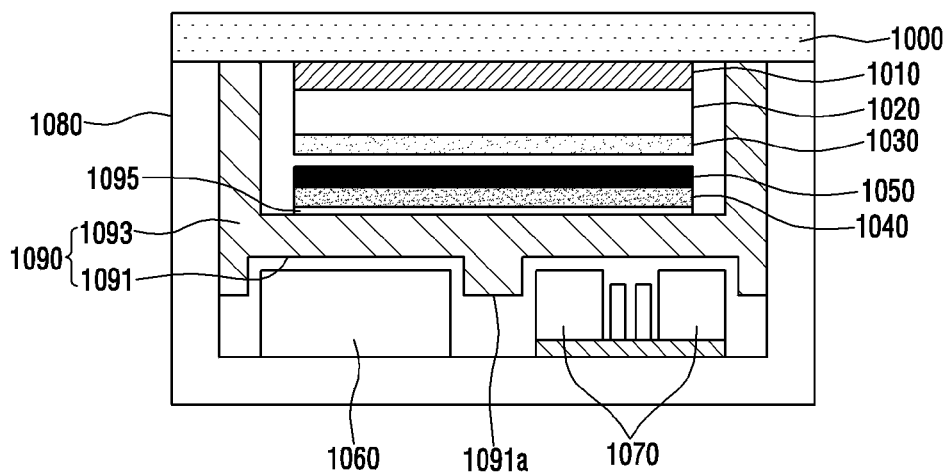
FIG. 10 is a cross sectional view of the touch input device according to still another embodiment of the present invention.

FIG. 10 is a cross sectional view of the touch input device according to still another embodiment of the present invention.

In the touch input device shown in FIG. 10 compared to the touch input device shown in FIG. 6, the pressure sensor 1050 is disposed on the elastic member 1040 on the reinforcing member 1095 on the mid-frame 1090. That is, the pressure sensor 1050 is disposed on the top surface of the elastic member 1040 on the top surface of the reinforcing member 1095 on the top surface of the mid-frame 1090. The remaining components are the same as those of the touch input device shown in FIG. 6.

In FIG. 10, the mid-frame 1090 is spaced apart from the display modules 1010 and 1020 by a predetermined interval. An air-gap may be formed in the interval. However, there is no limitation to this. A predetermined cushion may be disposed in the interval.

The operation method is the same as that of the embodiment of FIG. 6. The touch pressure can be detected by using the mid-frame 1090 provided under the pressure sensor 1050 as the reference potential layer.

Also, the operation method is the same as that of the embodiment of FIG. 9. The touch pressure can be detected by using the reference potential layer (not shown) disposed on the top surface or the bottom surface of the display modules 1010 and 1020. The touch pressure can be detected by using the reference potential layer (not shown) disposed between the LCD module 1010 and the backlight unit 1020. The touch pressure can be detected by using the reference potential layer (not shown) disposed between two layers among a plurality of layers which are within the LCD module 1010 and constitute the LCD module 1010. For example, when the LCD module 1010 includes the first substrate (or a color filter layer), the liquid crystal layer disposed under the first substrate, and the second substrate (or a TFT layer) disposed under the liquid crystal layer, the reference potential layer (not shown) may be disposed between the first substrate and the liquid crystal layer or may be disposed between the liquid crystal layer and the second substrate. Also, the touch pressure may be detected by using the metal cover 1030 as the reference potential layer.

Figure 11:
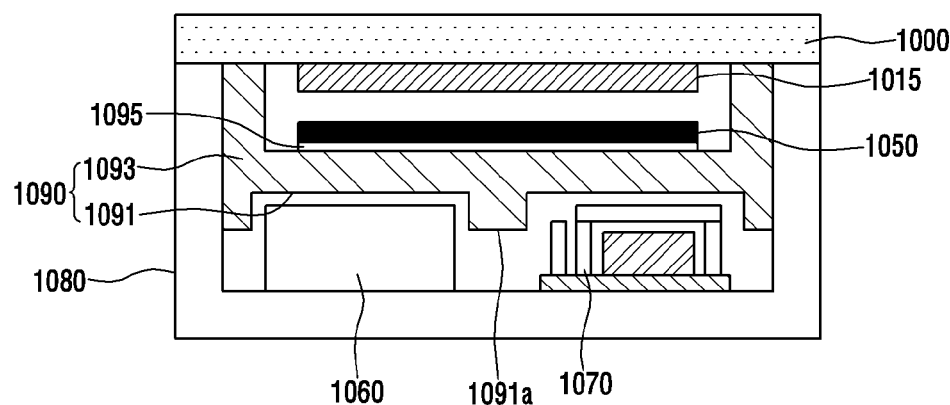
FIG. 11 is a cross sectional view of the touch input device according to still another embodiment of the present invention.

FIG. 11 is a cross sectional view of the touch input device according to still another embodiment of the present invention.

In the touch input device shown in FIG. 11 compared to the touch input device shown in FIG. 7, the pressure sensor 1050 is disposed on the reinforcing member 1095 on the mid-frame 1090. That is, the pressure sensor 1050 is disposed on the top surface of the reinforcing member 1095 on the top surface of the mid-frame 1090. The remaining components are the same as those of the touch input device shown in FIG. 7.

In the embodiment of FIG. 11, the metal cover 1030 shown in FIG. 9 may be further disposed between the display module 1015 and the pressure sensor 1050.

In FIG. 11, the mid-frame 1090 is spaced apart from the display module 1015 by a predetermined interval. An air-gap may be formed in the interval. However, there is no limitation to this. A predetermined cushion may be disposed in the interval.

The operation method may be different from that of the embodiment of FIG. 7. Specifically, the touch pressure can be detected by using the reference potential layer (not shown) disposed on the top surface or the bottom surface of the OLED module 1015. The touch pressure can be detected by using the reference potential layer (not shown) disposed between two layers among a plurality of layers which are within the OLED module 1015 and constitute the OLED module 1015. For example, when the OLED module 1015 includes the first substrate (or an encapsulation layer), an AMOLED layer disposed under the first substrate, and the second substrate (or a TFT layer) disposed under the AMOLED layer, the reference potential layer (not shown) may be disposed between the first substrate and the AMOLED layer or may be disposed between the AMOLED layer and the second substrate. Also, when the metal cover 1030 shown in FIG. 9 is further disposed, the touch pressure may be detected by using the metal cover as the reference potential layer.

Figure 12:
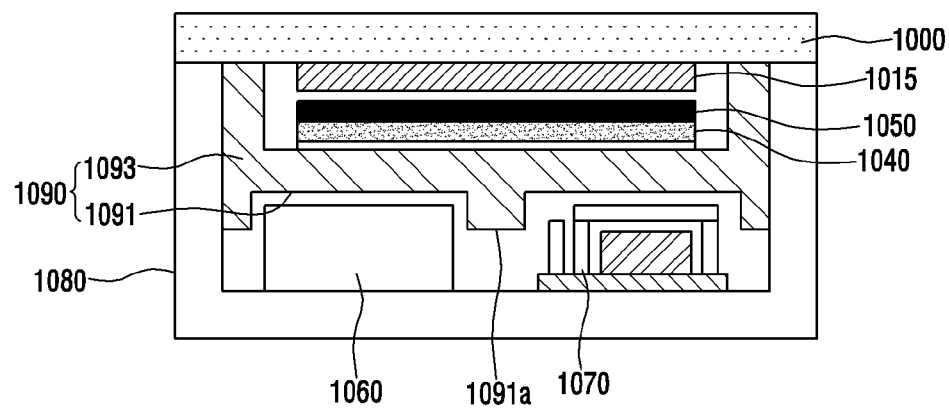
FIG. 12 is a cross sectional view of the touch input device according to still another embodiment of the present invention.

FIG. 12 is a cross sectional view of the touch input device according to still another embodiment of the present invention.

In the touch input device shown in FIG. 12 compared to the touch input device shown in FIG. 8, the pressure sensor 1050 is disposed on the elastic member 1040 on the reinforcing member 1095 on the mid-frame 1090. That is, the pressure sensor 1050 is disposed on the top surface of the elastic member 1040 on the top surface of the reinforcing member 1095 on the top surface of the mid-frame 1090. The remaining components are the same as those of the touch input device shown in FIG. 8.

In the embodiment of FIG. 12, the metal cover 1030 shown in FIG. 10 may be further disposed between the OLED module 1015 and the pressure sensor 1050.

In FIG. 12, the mid-frame 1090 is spaced apart from the display modules 1010 and 1020 by a predetermined interval. An air-gap may be formed in the interval. However, there is no limitation to this. A predetermined cushion may be disposed in the interval.

The operation method is the same as that of the embodiment of FIG. 8. That is, the touch pressure can be detected by using the mid-frame 1090 provided under the pressure sensor 1050 as the reference potential layer.

Also, the operation method is the same as that of the embodiment of FIG. 11. The touch pressure can be detected by using the reference potential layer (not shown) disposed on the top surface or the bottom surface of the OLED module 1015. The touch pressure can be detected by using the reference potential layer (not shown) disposed between two layers among a plurality of layers which are within the OLED module 1015 and constitute the OLED module 1015. For example, when the OLED module 1015 includes the first substrate (or an encapsulation layer), the AMOLED layer disposed under the first substrate, and the second substrate (or a TFT layer) disposed under the AMOLED layer, the reference potential layer (not shown) may be disposed between the first substrate and the AMOLED layer or may be disposed between the AMOLED layer and the second substrate. Also, when the metal cover 1030 shown in FIG. 10 is further disposed, the touch pressure may be detected by using the metal cover as the reference potential layer.

Figure 13A:
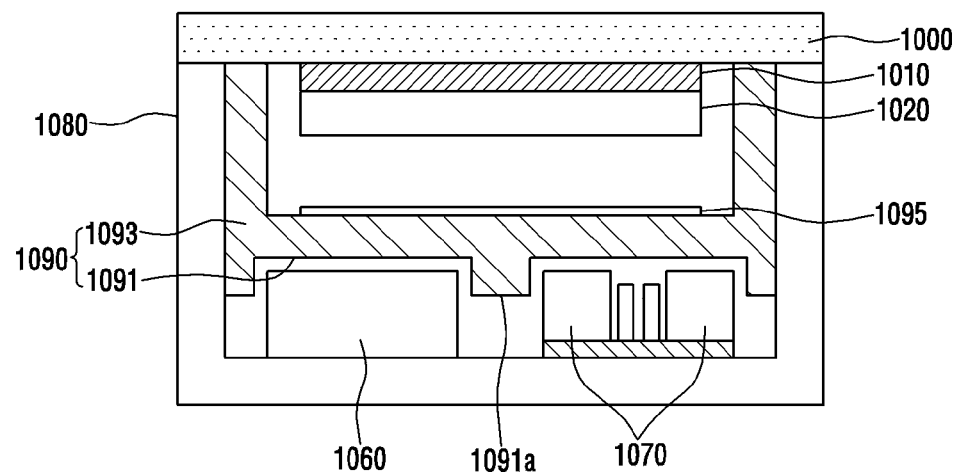
FIGS. 13a to 13d are cross sectional views of the touch input device according to still another embodiment of the present invention.
Figure 13B:
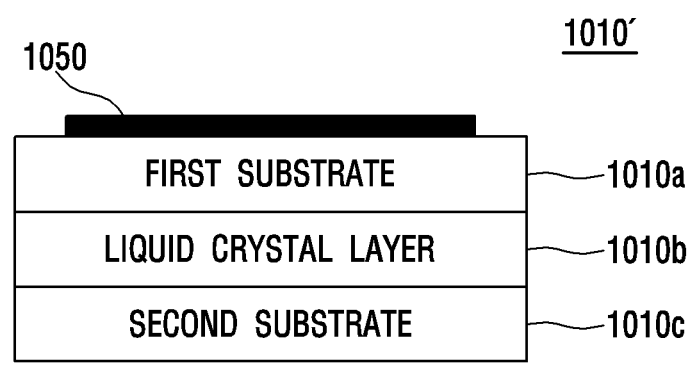
Figure 13C:
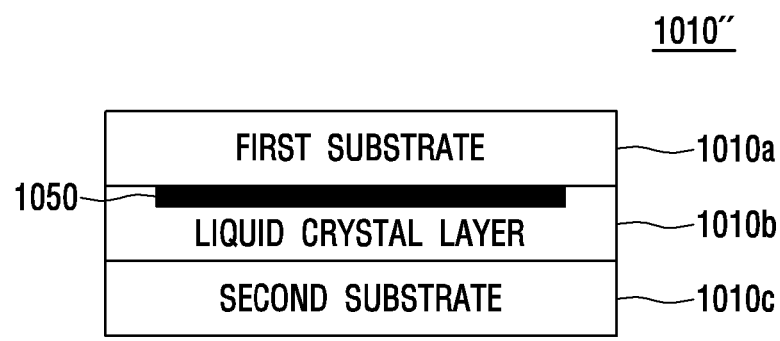
Figure 13D:
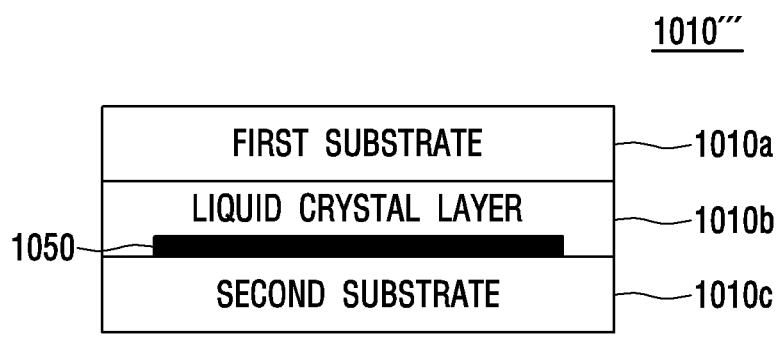

FIGS. 13a to 13d are cross sectional views of the touch input device according to still another embodiment of the present invention. Specifically, FIG. 13a is a cross sectional view of the touch input device according to still another embodiment of the present invention, and FIGS. 13b to 13d show various modified examples of the touch input device.

In the touch input device shown in FIGS. 13a to 13d compared to the touch input device shown in FIG. 5a, the pressure sensor 1050 is disposed within the LCD module 1010 of the display modules 1010 and 1020. That is, the pressure sensor 1050 of the touch input device shown in FIGS. 13a to 13d is embedded in the LCD module 1010 of the display modules 1010 and 1020. Various examples in which the pressure sensor 1050 is embedded in the LCD module 1010 will be described with reference to FIGS. 13b to 13d.

As shown in FIG. 13b, the LCD module 1010' includes the first substrate 1010a, the liquid crystal layer 1010b disposed under the first substrate, and the second substrate 1010c disposed under the liquid crystal layer 1010b. Here, the pressure sensor 1050 is directly formed on the top surface of the first substrate 1010a of the LCD module 1010'.

The first substrate 1010a may be made of glass or plastic. For example, the first substrate 1010a may be made of color filter glass.

The second substrate 1010c may be made of glass or plastic. For example, the second substrate 1010c may be made of TFT glass.

The pressure sensor 1050 may be directly formed on the top surface of the first substrate 1010a of the LCD module 1010' in various ways. For example, the pressure sensor 1050 may be directly formed on the top surface of the first substrate 1010a by using at least any one of a photolithography method, an etching resist method, an etching paste method, a gravure printing method, an inkjet printing method, a screen printing method, a flexography method, and a transfer printing method.

As shown in FIG. 13c, the LCD module 1010" includes the first substrate 1010a, the liquid crystal layer 1010b disposed under the first substrate, and the second substrate 1010c disposed under the liquid crystal layer 1010b. Here, the pressure sensor 1050 is directly formed on the bottom surface of the first substrate 1010a of the LCD module 1010". The method of directly forming the pressure sensor 1050 on the bottom surface of the first substrate 1010a may be any one of the above-described various methods.

As shown in FIG. 13d, the LCD module 1010''' includes the first substrate 1010a, the liquid crystal layer 1010b disposed under the first substrate, and the second substrate 1010c disposed under the liquid crystal layer 1010b. Here, the pressure sensor 1050 is directly formed on the top surface of the second substrate 1010c of the LCD module 1010'''. The method of directly forming the pressure sensor 1050 on the top surface of the second substrate 1010c may be any one of the above-described various methods. Though not shown in the figure, in still another embodiment, the pressure sensor 1050 may be directly formed on the bottom surface of the second substrate 1010c.

In the operation method of the touch input device shown in FIGS. 13b to 13d, the mid-frame 1090 provided under the display modules 1010 and 1020 in which the pressure sensor 1050 has been embedded is used as the reference potential layer, thereby detecting the touch pressure.

Here, though not shown in a separate figure, the metal cover 1030 shown in FIG. 5*a* may be disposed between the mid-frame 1090 and the display modules 1010 and 1020 in which the pressure sensor 1050 has been embedded. Also, the elastic member 1040 shown in FIG. 6 may be disposed between the mid-frame 1090 and the display modules 1010 and 1020 in which the pressure sensor 1050 has been embedded. Here, when the metal cover 1030 shown in FIG. 5*a* may be further disposed between the mid-frame 1090 and the display modules 1010 and 1020 in which the pressure sensor 1050 has been embedded, the touch pressure can be detected by using the metal cover as the reference potential layer.

Figure 14A:
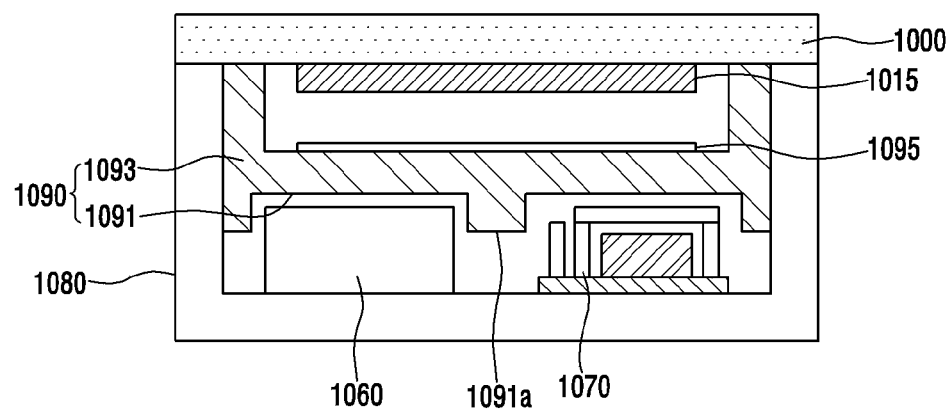
FIGS. 14a to 14e are cross sectional views of the touch input device according to still another embodiment of the present invention.

FIGS. 14*a* to 14*e* are cross sectional views of the touch input device according to still another embodiment of the present invention. Specifically, FIG. 14*a* is a cross sectional view of the touch input device according to still another embodiment of the present invention, and FIGS. 14*b* to 14*e* show various modified examples of the touch input device.

In the touch input device shown in FIGS. 14*a* to 14*e* compared to the touch input device shown in FIG. 7, the pressure sensor 1050 is disposed within the OLED module 1015, i.e., the display module. That is, the pressure sensor 1050 of the touch input device shown in FIGS. 14*a* to 14*e* is embedded in the OLED module 1015. Various examples in which the pressure sensor 1050 is embedded in the OLED module 1015 will be described with reference to FIGS. 14*b* to 14*e*.

Figure 14B:
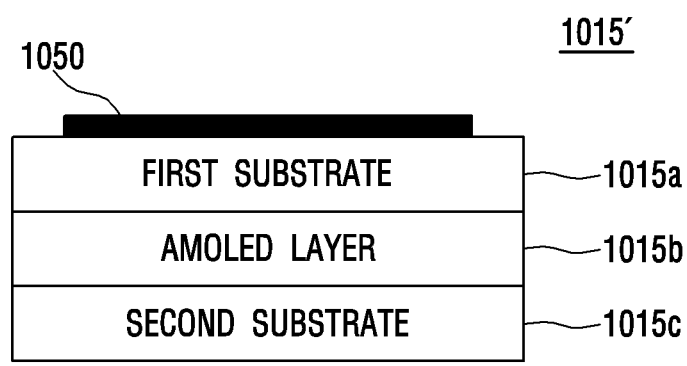

As shown in FIG. 14*b*, the OLED module 1015' includes a first substrate 1015*a*, an AMOLED layer 1015*b* disposed under the first substrate, and a second substrate 1015*c* disposed under the AMOLED layer 1015*b*. Here, the pressure sensor 1050 is directly formed on the top surface of the first substrate 1015*a* of the OLED module 1015'.

The first substrate 1015*a* may be made of glass or plastic. For example, the first substrate 1015*a* may be made of encapsulated glass.

The second substrate 1015*c* may be made of glass or plastic. For example, the second substrate 1015*c* may be made of TFT glass.

The pressure sensor 1050 may be directly formed on the top surface of the first substrate 1015*a* of the OLED module 1015' in various ways. For example, the pressure sensor 1050 may be directly formed on the top surface of the first substrate 1015*a* by using at least any one of a photolithography method, an etching resist method, an etching paste method, a gravure printing method, an inkjet printing method, a screen printing method, a flexography method, and a transfer printing method.

Figure 14C:
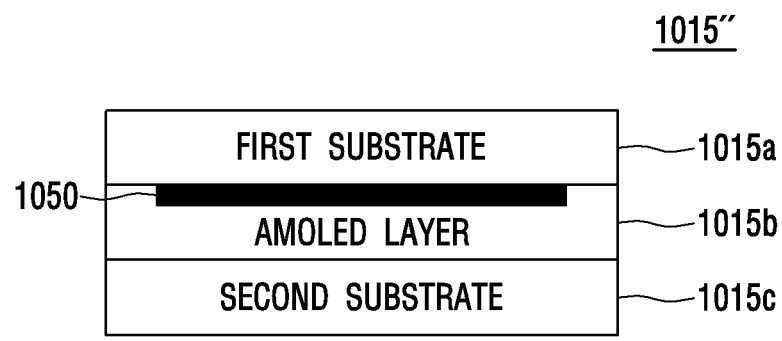

As shown in FIG. 14*c*, the OLED module 1015" includes the first substrate 1015*a*, the AMOLED layer 1015*b* disposed under the first substrate, and the second substrate 1015*c* disposed under the AMOLED layer 1015*b*. Here, the pressure sensor 1050 is directly formed on the bottom surface of the first substrate 1015*a* of the OLED module 1015". The method of directly forming the pressure sensor 1050 on the bottom surface of the first substrate 1015*a* may be any one of the above-described various methods.

Figure 14D:
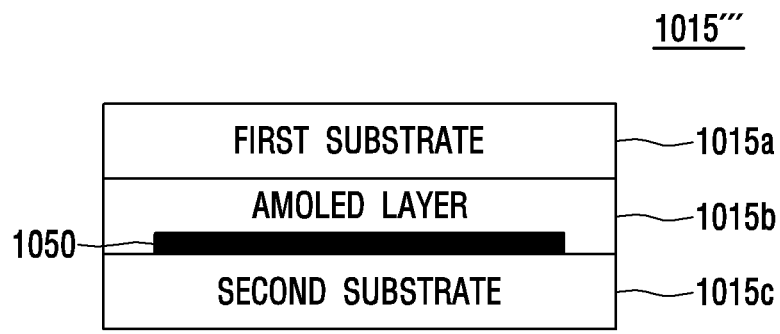

As shown in FIG. 14*d*, the OLED module 1015''' includes the first substrate 1015*a*, the AMOLED layer 1015*b* disposed under the first substrate, and the second substrate 1015*c* disposed under the AMOLED layer 1015*b*. Here, the pressure sensor 1050 is directly formed on the top surface of the second substrate 1015*c* of the OLED module 1015'''. The method of directly forming the pressure sensor 1050 on the top surface of the second substrate 1015*c* may be any one of the above-described various methods.

Figure 14E:
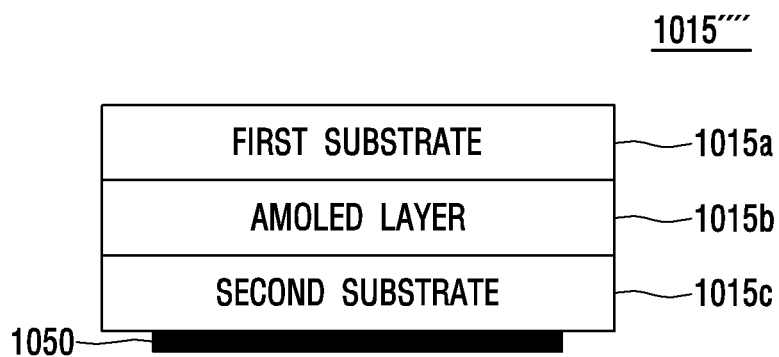

As shown in FIG. 14*e*, the OLED module 1015'''' includes the first substrate 1015*a*, the AMOLED layer 1015*b* disposed under the first substrate, and the second substrate 1015*c* disposed under the AMOLED layer 1015*b*. Here, the pressure sensor 1050 is directly formed on the bottom surface of the second substrate 1015*c* of the OLED module 1015''''. The method of directly forming the pressure sensor 1050 on the bottom surface of the second substrate 1015*c* may be any one of the above-described various methods.

In the operation method of the touch input device shown in FIGS. 14*b* to 14*e*, the mid-frame 1090 provided under the display module 1015 in which the pressure sensor 1050 has been embedded is used as the reference potential layer, thereby detecting the touch pressure. Here, though not shown in a separate figure, the metal cover 1030 shown in FIG. 5*a* may be disposed between the mid-frame 1090 and the display module 1015 in which the pressure sensor 1050 has been embedded. Also, the elastic member 1040 shown in FIG. 6 may be disposed between the mid-frame 1090 and the display module 1015 in which the pressure sensor 1050 has been embedded. Here, when the metal cover 1030 shown in FIG. 5*a* may be further disposed between the mid-frame 1090 and the display modules 1010 and 1020 in which the pressure sensor 1050 has been embedded, the touch pressure can be detected by using the metal cover as the reference potential layer.

Figure 15A:
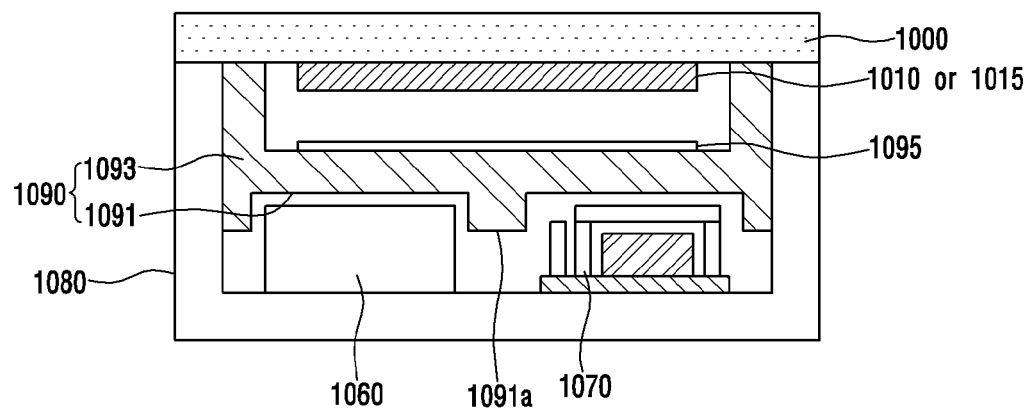
FIGS. 15a to 15d are cross sectional views of the touch input device according to still another embodiment of the present invention.
Figure 15B:
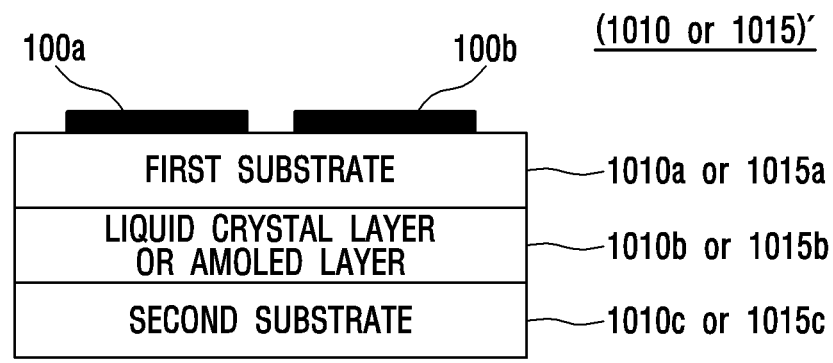
Figure 15C:
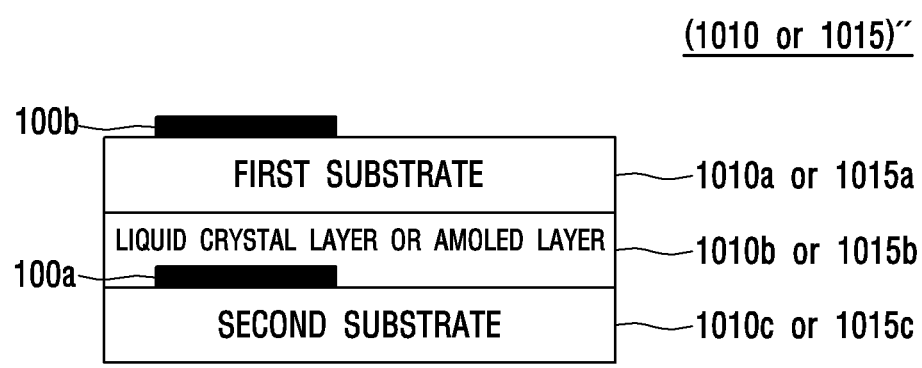
Figure 15D:
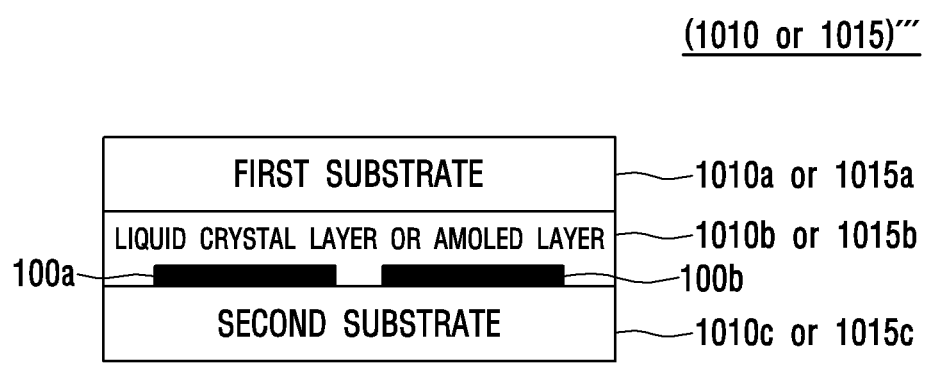

FIGS. 15*a* to 15*d* are cross sectional views of the touch input device according to still another embodiment of the present invention. Specifically, FIG. 15*a* is a cross sectional view of the touch input device according to still another embodiment of the present invention, and FIGS. 15*b* to 15*d* show various modified examples of the touch input device.

The touch input device shown in FIGS. 15*a* to 15*d* compared to the touch input device shown in FIG. 7 does not include the pressure sensor 1050.

The touch input device shown in FIGS. 15*a* to 15*d* is able to detect the touch pressure by using touch sensors 100*a* and 100*b* without a separate pressure sensor. The touch sensors 100*a* and 100*b* are disposed on the display modules 1010 and 1015. This will be described in detail with reference to FIGS. 15*b* to 15*d*.

In FIG. 15*a*, the LCD module 1010 shown in FIG. 13*a* and the OLED module 1015 shown in FIG. 14*a* may be disposed under the cover 1000. Meanwhile, when the LCD module 1010 is disposed under the cover 1000, the backlight unit 1020 shown in FIG. 13*a* is omitted under the LCD module 1010.

As shown in FIG. 15*b*, the touch sensors 100*a* and 100*b* include a plurality of electrodes 100*a* and 100*b* for detecting the touch position.

Here, the plurality of the electrodes 100*a* and 100*b* include the drive electrode 100*a* to which a drive signal for the mutual capacitance type is input and the receiving electrode 100*b* from which a sensing signal is output. The drive electrode 100*a* and the receiving electrode 100*b* may be directly formed apart from each other on the top surface of the first substrate 1010*a* or 1015*a* of the LCD module 1010 or the OLED module 1015.

Meanwhile, each of the plurality of the electrodes 100*a* and 100*b* may be a self-electrode for the self-capacitance type, to which the drive signal is input and from which the sensing signal is output.

The method for directly forming the plurality of the electrodes 100*a* and 100*b* on the top surface of the first substrate 1010a or 1015a may be at least any one of a photolithography method, an etching resist method, an etching paste method, a gravure printing method, an inkjet printing method, a screen printing method, a flexography method, and a transfer printing method.

In the touch input device including the display module (1010 or 1015)' shown in FIG. 15b, the touch pressure can be detected by using the mid-frame 1090 as the reference potential layer on the basis of the capacitance which changes according to the change of the distance between the mid-frame 1090 and at least any one of the plurality of the electrodes 100a and 100b. In the detection of the touch pressure through use of the change of distance between the reference potential layer and the plurality of the electrodes 100a and 100b, the touch pressure may be detected in the mutual capacitance type by distinguishing the plurality of the electrodes 100a and 100b as the drive electrode and the receiving electrode or may be detected even in the self-capacitance type by using the plurality of the electrodes 100a and 100b as the self-electrode.

As shown in FIG. 15c, the touch sensors 100a and 100b include the drive electrode 100a and the receiving electrode 100b. The drive electrode 100a is directly formed on the top surface of the second substrate 1010c or 1015c of the LCD module 1010 or the OLED module 1015, and the receiving electrode 100b is directly formed on the top surface of the first substrate 1010a or 1015a of the LCD module 1010 or the OLED module 1015. The method of directly forming the drive electrode 100a on the top surface of the second substrate 1010c or 1015c and of directly forming the receiving electrode 100b on the top surface of the first substrate 1010a or 1015a may be any one of the above-described various methods.

In the touch input device including the display module (1010 or 1015)" shown in FIG. 15c, the touch pressure can be detected by using the mid-frame 1090 as the reference potential layer on the basis of the capacitance which changes according to the change of the distance between the mid-frame 1090 and at least any one of the drive electrode 100a and the receiving electrode 100b.

Meanwhile, though not shown in a separate figure, in FIG. 15c, the drive electrode 100a may be disposed on the bottom surface of the first substrate 1010a or 1015a. In this case, the touch input device is also able to operate in the same manner as the touch input device including the display module (1010 or 1015)" of FIG. 15c.

As shown in FIG. 15d, the touch sensors 100a and 100b include the drive electrode 100 and the receiving electrode 100b for detecting the touch position. The drive electrode 100a and the receiving electrode 100b may be directly formed apart from each other on the top surface of the second substrate 1010c or 1015c of the LCD module 1010 or the OLED module 1015.

Here, the drive electrode 100 and the receiving electrode 100b may be a common electrode for driving the liquid crystal layer or the AMOLED layer 1010b or 1015b.

In the touch input device including the display module (1010 or 1015)''' shown in FIG. 15d, the touch pressure can be detected by using the mid-frame 1090 as the reference potential layer on the basis of the capacitance which changes according to the change of the distance between the mid-frame 1090 and at least any one of the drive electrode 100a and the receiving electrode 100b.

Meanwhile, though not shown in a separate figure, in FIG. 15d, the drive electrode 100a and the receiving electrode 100b may be disposed on the bottom surface of the first substrate 1010a or 1015a. In this case, the touch input device is also able to operate in the same manner as the touch input device including the display module (1010 or 1015)''' of FIG. 15d.

Though not shown in a separate figure, the metal cover 1030 shown in FIG. 5a may be disposed between the mid-frame 1090 and the display module 1010 or 1015. Also, the elastic member 1040 shown in FIG. 6 may be disposed between the mid-frame 1090 and the display module 1010 or 1015. Here, when the metal cover 1030 shown in FIG. 5a may be further disposed between the mid-frame 1090 and the display module 1010 or 1015, the touch pressure can be detected by using the metal cover as the reference potential layer.

Figure 16:
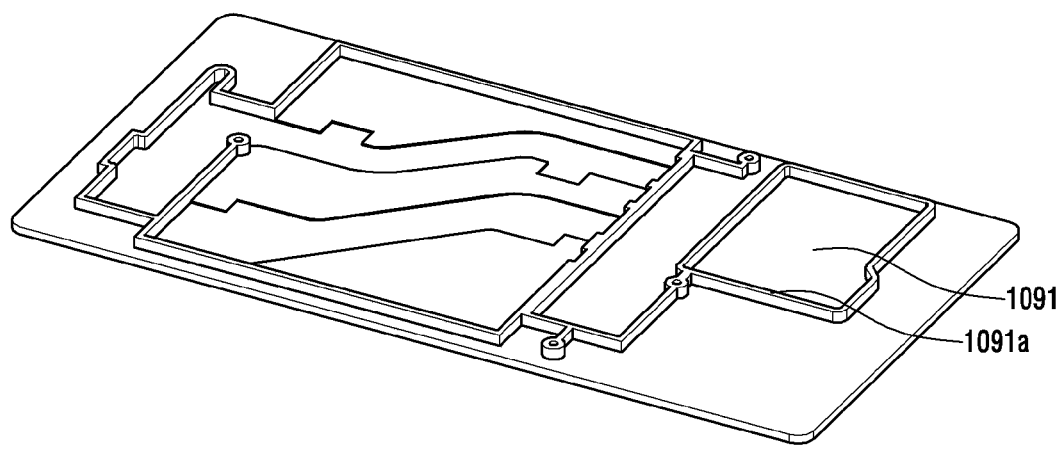
FIG. 16 is a perspective view showing a portion of a bottom surface of a base plate 1091 of a mid-frame 1090 shown in FIGS. 5 to 15.

FIG. 16 is a perspective view showing a portion of the bottom surface of the base plate 1091 of the mid-frame 1090 shown in FIGS. 5a to 15.

Referring to FIG. 16, the guide member 1091a shown in FIGS. 5a to 15 is disposed on the bottom surface of the mid-frame 1090, specifically, on the bottom surface of the base plate 1091 of the mid-frame 1090.

The guide member 1091a protrudes upward from the bottom surface of the base plate 1091 and divides the bottom surface of the base plate 1091 into a plurality of portions. The plurality of the portions formed by the guide member 1091a, together with the bottom surface of the base plate 1091, form a plurality of receiving spaces. The battery 1060, the mainboard 10, etc., shown in FIGS. 5a to 15 are disposed in the plurality of the formed receiving spaces.

The guide member 1091a may function to not only guide the battery 1060, the mainboard 10, etc., shown in FIGS. 5a to 15 but also support the base plate 1091 of the mid-frame 1090 such that the base plate 1091 is not bent or broken by an external force. It is important that the base plate 1091 should not be bent or broken by an external force because the base plate 1091 functions as the reference potential layer for the pressure electrode of the pressure sensor 1050 shown in FIGS. 5a and 6 to 15. However, it is not sufficient to completely eliminate or reduce the bending or breakage of the base plate 1091 due to the external force only by the guide member 1091a disposed on the bottom surface of the base plate 1091. The bending or breakage of the base plate 1091 due to the external force can be significantly reduced or eliminated by the reinforcing member 1095 shown in FIGS. 5a to 15 as well as the guide member 1091a. This will be described below with reference to FIGS. 17 to 21.

Figure 17:
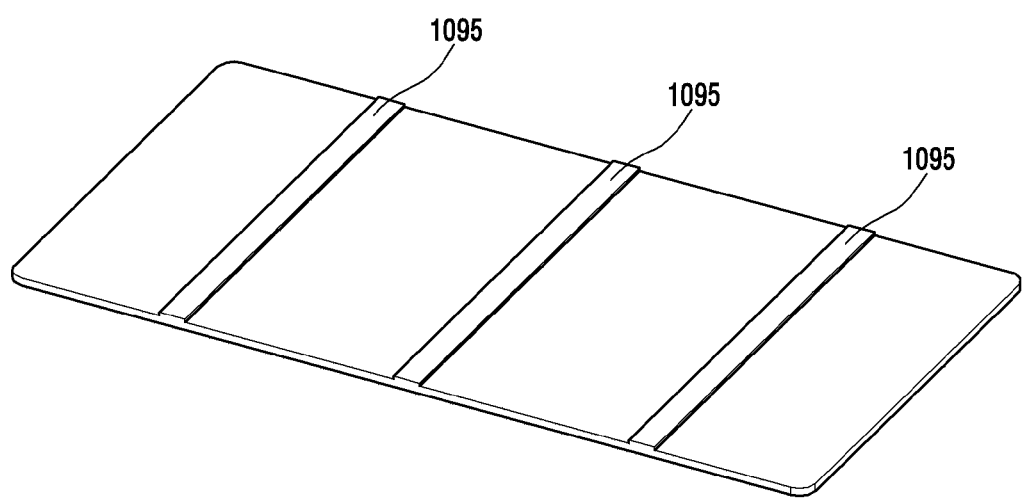
FIG. 17 is a perspective view showing a portion of a top surface of the base plate 1091 of the mid-frame 1090 shown in FIGS. 5 to 15.
Figure 18:
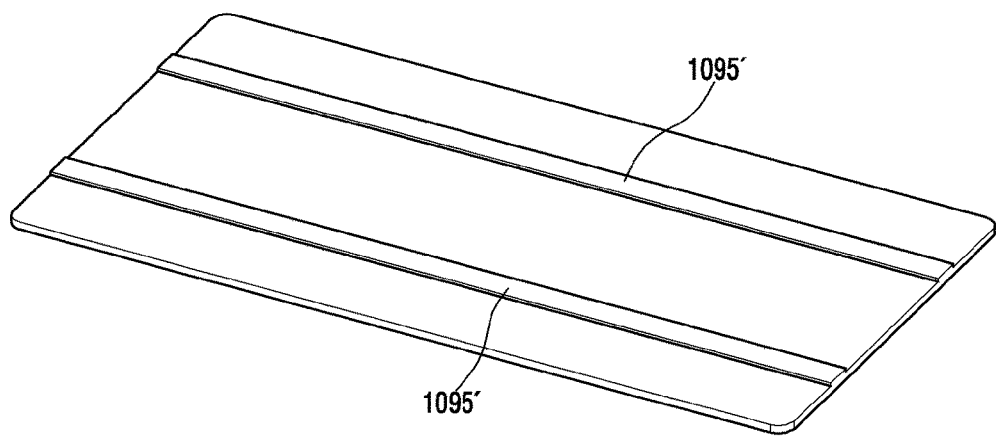
FIG. 18 is a perspective view showing a modified example of a reinforcing member shown in FIG. 17.
Figure 19:
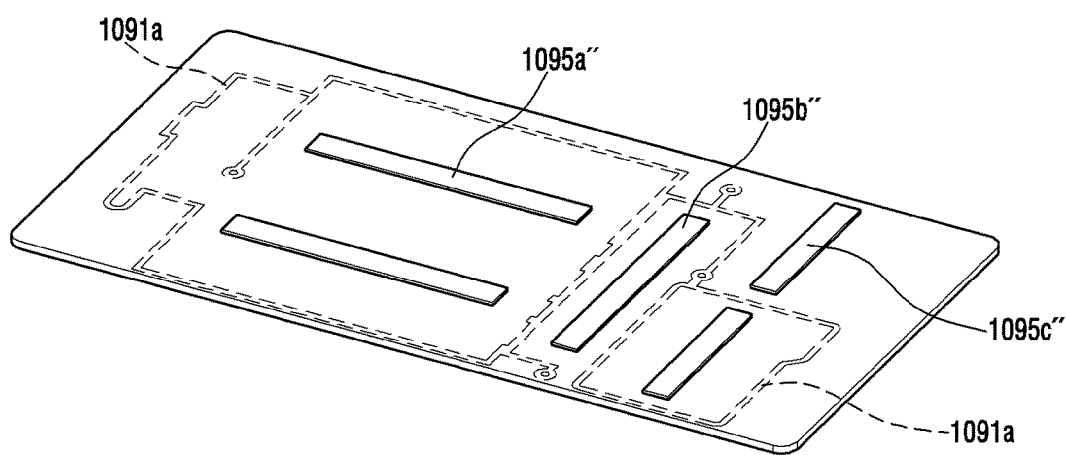
FIG. 19 is a perspective view showing another modified example of the reinforcing member shown in FIG. 17.
Figure 20:
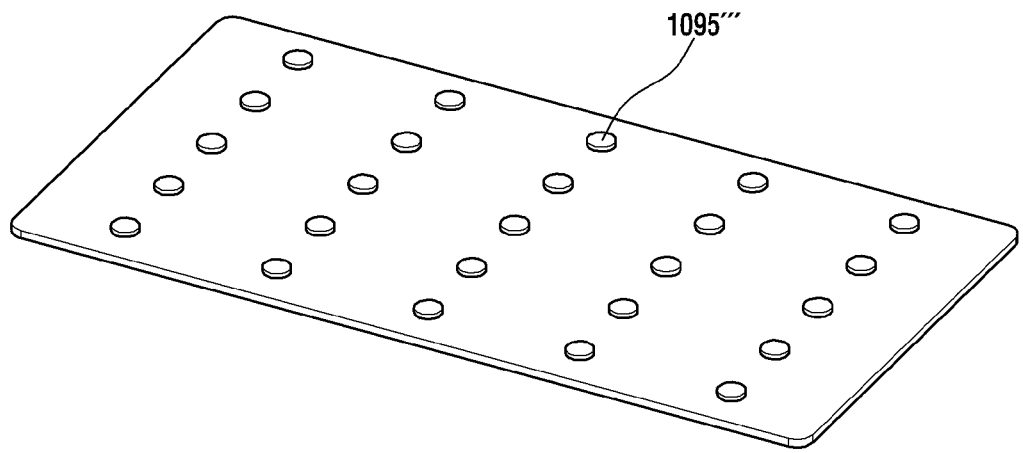
FIG. 20 is a perspective view showing further another modified example of the reinforcing member shown in FIG. 17.
Figure 21:
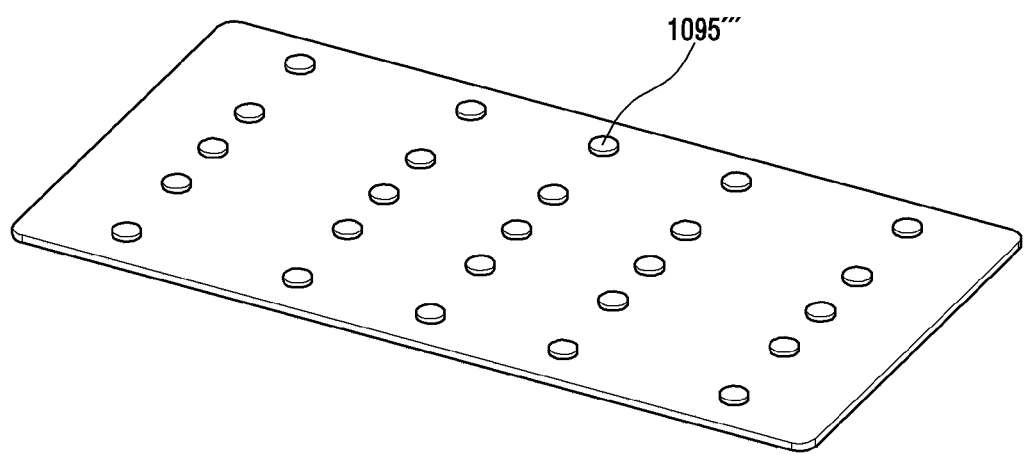
FIG. 21 is a perspective view showing yet another modified example of the reinforcing member shown in FIG. 17.

FIG. 17 is a perspective view showing a portion of a top surface of the base plate 1091 of the mid-frame 1090 shown in FIGS. 5a to 15. FIG. 18 is a perspective view showing a modified example of the reinforcing member shown in FIG. 17. FIG. 19 is a perspective view showing another modified example of the reinforcing member shown in FIG. 17. FIG. 20 is a perspective view showing further another modified example of the reinforcing member shown in FIG. 17. FIG. 21 is a perspective view showing yet another modified example of the reinforcing member shown in FIG. 17.

Referring to FIG. 17, the reinforcing member 1095 shown in FIGS. 5a to 15 is disposed on the top surface of the mid-frame 1090, specifically, on the top surface of the base plate 1091 of the mid-frame 1090.

The reinforcing member 1095 protrudes upward from the top surface of the base plate 1091 and may be integrally formed with the base plate 1091. However, there is no limitation to this. The reinforcing member 1095 may be formed separately from the base plate 1091 and may be attached or coupled to the top surface of the base plate 1091.

The reinforcing member 1095 may protrude in a direction perpendicular to the longitudinal direction of the top surface of the base plate 1091. As shown in FIG. 18, the reinforcing member 1095' may protrude in the longitudinal direction of the top surface of the base plate 1091. Also, though not shown in the figure, the reinforcing member 1095 may extend in a diagonal direction of the top surface of the base plate 1091 and may have a predetermined length.

The reinforcing member 1095 may have, as shown in FIGS. 17 to 19, a quadrangular cross section. However, the shape of the cross section of the reinforcing member 1095 is not limited to this. The cross section of the reinforcing member 1095 may have various shapes such as a triangle, an inverted triangle, a polygon, a semi-ellipse, a semicircle or the like.

Also, unlike FIGS. 17 to 19, the reinforcing member 1095 may have a shape in which the reinforcing member 1095 is wholly or partially bent without being formed straight in one direction.

Also, as shown in FIG. 19, a plurality of the reinforcing members 1095$a''$, 1095$b''$, and 1095$c''$ may be disposed on the top surface of the base plate 1091. The shape and formation direction of each of the plurality of the reinforcing members 1095$a''$, 1095$b''$, and 1095$c''$ may be the same as those of the reinforcing members 1095 and 1095' shown in FIGS. 17 to 18. However, the shape and formation direction are not limited to this. Each of the reinforcing members 1095$a''$, 1095$b''$, and 1095$c''$ may be formed in a diagonal direction.

In FIG. 19, the plurality of the reinforcing members 1095$a''$, 1095$b''$, and 1095$c''$ may be disposed in such a manner as to deviate from the formation position of the guide member 1091$a$ disposed on the bottom surface of the base plate 1091 because the base plate 1091 is easily bent or broken due to the external force at a portion where the guide member 1091$a$ is not formed. Therefore, the plurality of the reinforcing members 1095$a''$, 1095$b''$, and 1095$c''$ may be disposed on the top surface of the base plate 1091 and may be disposed to have a predetermined shape and a formation direction on the back side of the portion where the guide member 1091$a$ is not formed. The plurality of the reinforcing members 1095$a''$, 1095$b''$, and 1095$c''$ are disposed in such a manner as to deviate from the formation position of the guide member 1091$a$ disposed on the bottom surface of the base plate 1091, so that the base plate 1091 of the mid-frame 1090 becomes stronger to the bending or breakage due to the external force. As a result, even when a predetermined external force is applied, the pressure electrode of the pressure sensor 1050 shown in FIGS. 5$a$ to 15 can function well as the reference potential layer. Accordingly, the touch pressure of the touch input device can be accurately detected.

Also, as shown in FIG. 20, the reinforcing member 1095' may have a circular plate shape like a coin. Here, the shape of the reinforcing member 1095''' is not limited to the circular plate shape. For example, the reinforcing member 1095''' may have a quadrangular plate shape, a polygonal plate shape, or an elliptical plate shape.

The plurality of the reinforcing members 1095' may be uniformly disposed on the top surface of the base plate 1091.

Here, as shown in FIG. 21, the intervals among the plurality of the reinforcing members 1095''' may be different from each other on the top surface of the base plate 1091. For example, the closer it is to the central portion of the top surface of the base plate 1091, the smaller the interval between the two adjacent reinforcing members 1095' is. This is because the central portion of the top surface of the base plate 1091 may be also bent more than the other portions. The base plate 1091 shown in FIG. 21 can be bent less than the base plate 1091 having its top surface on which the plurality of the reinforcing members 1095''' are, as shown in FIG. 20, uniformly disposed.

Meanwhile, in order to solve the problem that the central portion of the top surface of the base plate 1091 is also bent more than the other portions, though not shown in the figure, the sizes (widths or thicknesses) of the plurality of the reinforcing members 1095' shown in FIG. 20 may be different from each other. For example, the size of the reinforcing member 1095' disposed in the central portion of the top surface of the base plate 1091 may be larger than the size of the reinforcing member 1095' disposed in the other positions of the top surface of the base plate 1091. Alternatively, the size of the reinforcing member 1095' becomes smaller toward the other portions from the central portion of the top surface of the base plate 1091.

In FIGS. 17 to 21, if the width, length, and thickness of the reinforcing member 1095, 1095', 1095$a''$, 1095$b''$, 1095$c''$, 1095''' are too large, the pressing by the input touch may not occur or may occur very slightly in the touch input device. Therefore, it is desirable that the width, length, and thickness of the reinforcing member 1095, 1095', 1095$a''$, 1095$b''$, 1095$c''$, 1095''' should be enough for the pressing by the input touch to occur.

Figure 22:
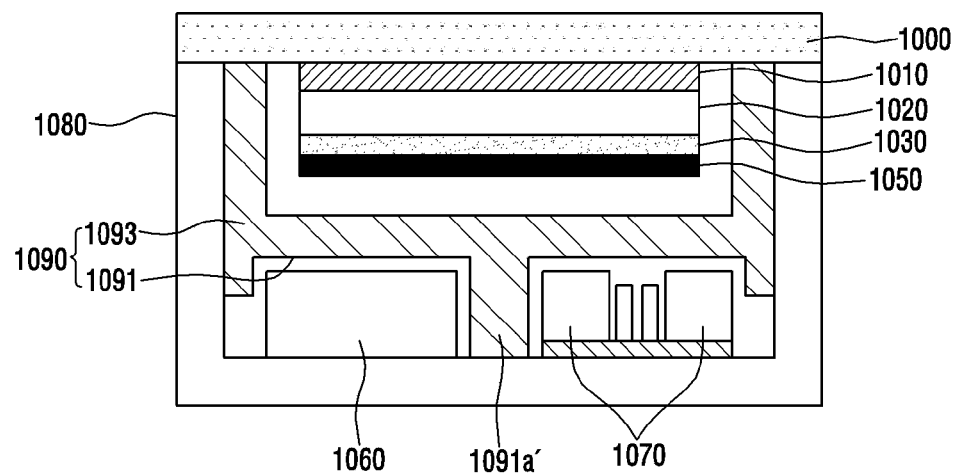
FIG. 22 is a cross sectional view of the touch input device according to still another embodiment of the present invention.

FIG. 22 is a cross sectional view of the touch input device according to still another embodiment of the present invention.

In terms of the mid-frame 1090, the touch input device shown in FIG. 22 is different from the touch input device shown in FIG. 5$a$.

As with the touch input device shown in FIG. 5$a$, the strength of the mid-frame 1090 of the touch input device shown in FIG. 22 is reinforced, it is possible to constantly maintain the pressure sensitivity even when the external force is applied. However, the structure of the touch input device shown in FIG. 22, which shows the above effect, is different from the structure of the touch input device shown in FIG. 5$a$. The difference results from the mid-frame 1090. Hereinafter, the structure of the mid-frame 1090 of the touch input device shown in FIG. 22 will be described in detail.

Referring to FIG. 22, the mid-frame 1090 includes the base plate 1091. The base plate 1091 includes a top surface and a bottom surface thereof.

The battery 1060 and the mainboard 1070 are disposed under the bottom surface of the base plate 1091. A guide member 1091$a'$ which guides the battery 1060 and the mainboard 1070 may be disposed on the bottom surface of the base plate 1091.

The guide member 1091$a'$ may be integrally formed with the bottom surface of the base plate 1091 or may be attached to the bottom surface of the base plate 1091.

The guide member 1091$a'$, together with the bottom surface of the base plate 1091, may form a space for receiving the battery 1060 and the mainboard 1070.

Since the movements of the battery 1060 and the mainboard 1070 are limited by the guide member 1091$a'$, it is possible to prevent the battery 1060 and the mainboard 1070 from deviating from their regular positions.

An end of the guide member 1091$a'$ contacts the bottom surface of the housing 1080. When the end of the guide member 1091$a'$ contacts the bottom surface of the housing 1080, the housing 1080 supports directly the guide member 1091$a'$, so that it is possible to reduce the bending of the base plate 1091 which is caused by a predetermined force such as an external force by the user or external equipment, gravity, reaction by a momentary movement in a particular direction, etc. In other words, the guide member 1091$a'$ can more reinforce the strength of the base plate 1091 than the base plate 1091 shown in FIG. 5*a*.

Further, when the end of the guide member 1091*a*' contacts the bottom surface of the housing 1080, it is possible to constantly maintain the pressure sensitivity of the touch input device. For example, in a case where the base plate 1091 is the reference potential layer of the pressure sensor, when the base plate 1091 is deformed by the external force, the distance between the pressure sensor and the base plate 1091 as the reference potential layer is changed, so that the pressure sensitivity may be changed according to the position. Accordingly, the end of the guide member 1091*a*' contacts the bottom surface of the housing 1080, it is possible to constantly maintain the pressure sensitivity of the touch input device.

Figure 23:
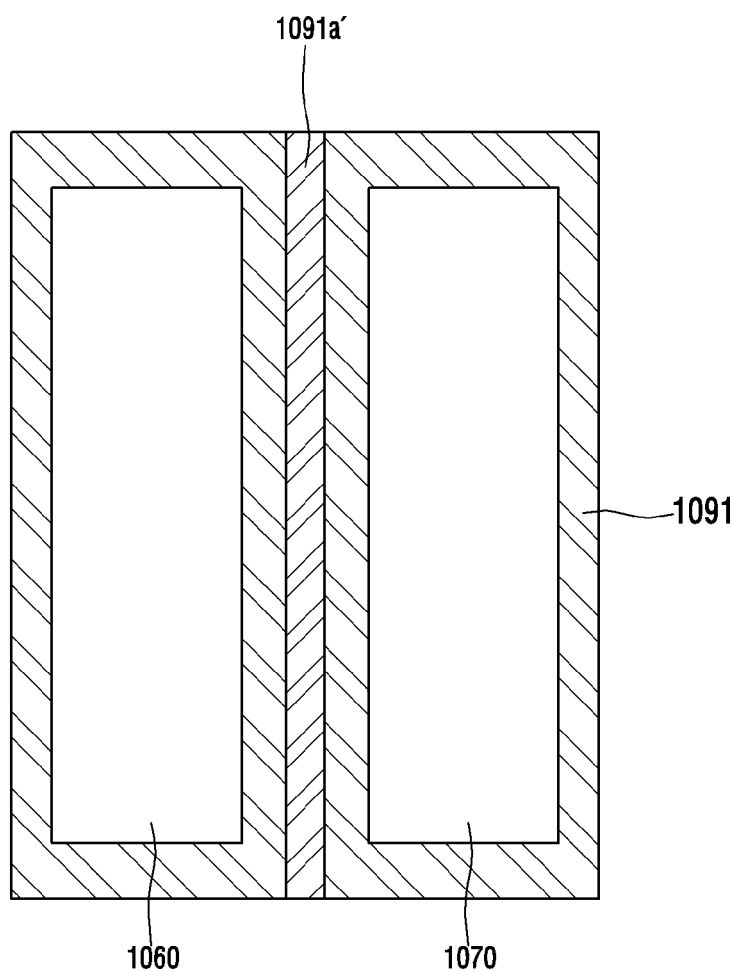
FIG. 23 is a front view the bottom surface of the base plate 1091 of the mid-frame 1090 shown in FIG. 22.

FIG. 23 is a front view the bottom surface of the base plate 1091 of the mid-frame 1090 shown in FIG. 22.

Referring to FIG. 23, the bottom surface of the base plate 1091 has a predetermined horizontal length and a predetermined vertical length. The vertical length is larger than the horizontal length. The guide member 1091*a*' may be disposed on the bottom surface of the base plate 1091 and may be disposed on the middle portion of the bottom surface of the base plate 1091 in the vertically longitudinal direction of the bottom surface of the base plate 1091. Here, the middle portion of the bottom surface of the base plate 1091 may correspond to a certain area including the center of the bottom surface of the base plate 1091. The battery 1060 may be disposed on the left side with respect to the guide member 1091*a*' and the mainboard 1070 may be disposed on the right side with respect to the guide member 1091*a*'.

For reference, the guide member 1091*a* shown in FIG. 5*a* may also have the shape shown in FIG. 23.

Figure 24:
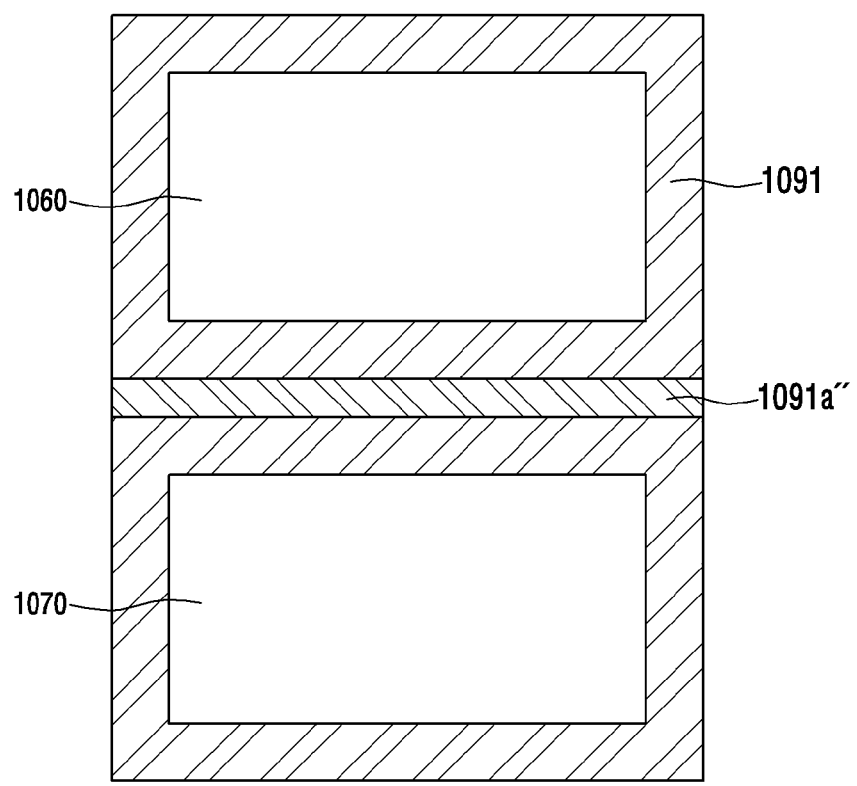
FIG. 24 shows a modified example of FIG. 23 and is a front view the bottom surface of the base plate 1091 of the mid-frame 1090 shown in FIG. 22.

FIG. 24 shows a modified example of FIG. 23 and is a front view the bottom surface of the base plate 1091 of the mid-frame 1090 shown in FIG. 22.

Referring to FIG. 24, the bottom surface of the base plate 1091 has a predetermined horizontal length and a predetermined vertical length. The horizontal length is larger than the vertical length. The guide member 1091*a*" may be disposed on the bottom surface of the base plate 1091 and may be disposed on the middle portion of the bottom surface of the base plate 1091 in the horizontally longitudinal direction of the bottom surface of the base plate 1091. Here, the middle portion of the bottom surface of the base plate 1091 may correspond to a certain area including the center of the bottom surface of the base plate 1091. The battery 1060 may be disposed on the top side with respect to the guide member 1091*a*" and the mainboard 1070 may be disposed on the bottom side with respect to the guide member 1091*a*".

For reference, the guide member 1091*a* shown in FIG. 5*a* may also have the shape shown in FIG. 24.

Figure 25:
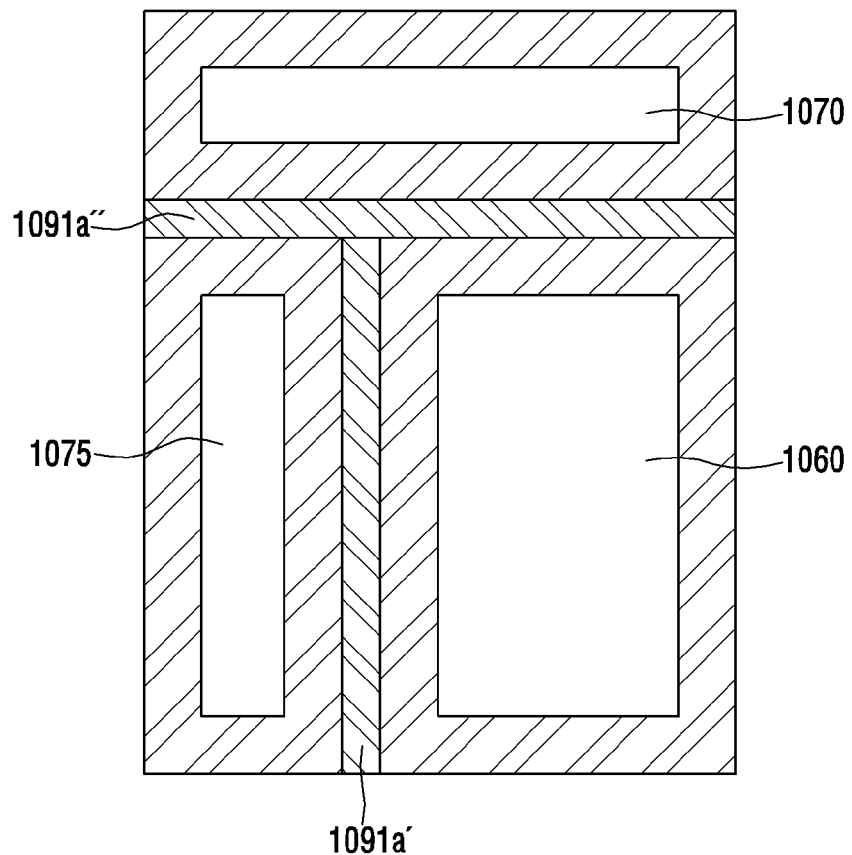
FIG. 25 shows a modified example through the combination of FIG. 23 and FIG. 24 and is a front view the bottom surface of the base plate 1091 of the mid-frame 1090 shown in FIG. 22.

FIG. 25 shows a modified example through the combination of FIG. 23 and FIG. 24 and is a front view the bottom surface of the base plate 1091 of the mid-frame 1090 shown in FIG. 22.

Referring to FIG. 25, the bottom surface of the base plate 1091 has a predetermined horizontal length and a predetermined vertical length. The vertical length is larger than the horizontal length. The first guide member 1091*a*' may be disposed on the bottom surface of the base plate 1091 and may be disposed in the horizontally longitudinal direction of the bottom surface of the base plate 1091. The second guide member 1091*a*" may be disposed on the bottom surface of the base plate 1091 and may be disposed in the vertically longitudinal direction of the bottom surface of the base plate 1091. The first guide member 1091*a*' and the second guide member 1091*a*" may be connected to each other. One end of the first guide member 1091*a*' may be connected to the second guide member 1091*a*".

The mainboard 1070 may be disposed on the top side with respect to the first guide member 1091*a*', and the battery 1060 may be disposed on the right side with respect to the second guide member 1091*a*". Other members 1075 may be further disposed on the left side with respect to the second guide member 1091*a*".

For reference, the guide member 1091*a* shown in FIG. 5*a* may also have the shape shown in FIG. 25.

Figure 26:
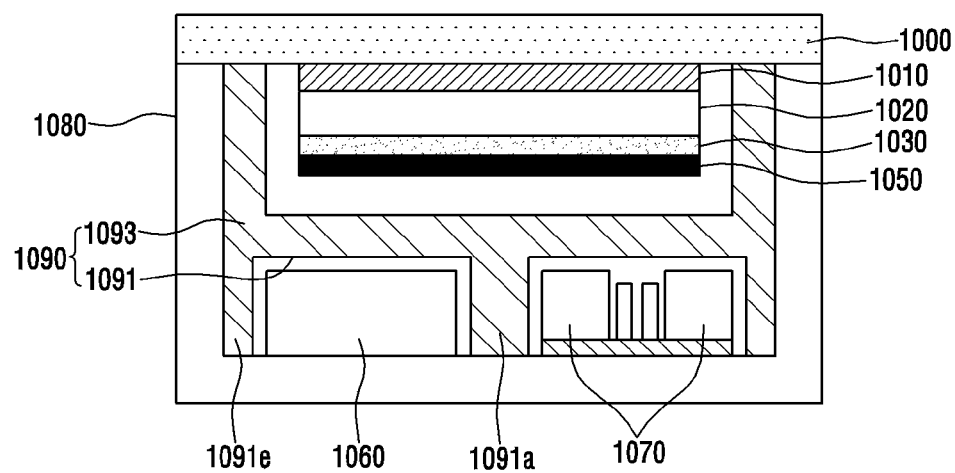
FIG. 26 shows a modified example of the touch input device shown in FIG. 22.

FIG. 26 shows a modified example of the touch input device shown in FIG. 22.

Referring to FIG. 26, in terms of the mid-frame 1090, the touch input device shown in FIG. 26 is different from the touch input device shown in FIG. 22.

Compared to the mid-frame 1090 shown in FIG. 22, the mid-frame 1090 shown in FIG. 26 further includes an edge guide member 1091*e*. The edge guide member 1091*e* is disposed on the edge of the bottom surface of the base plate 1091 of the mid-frame 1090.

An end of the edge guide member 1091*e* contacts the bottom surface of the housing 1080. When the end of the edge guide member 1091*e* contacts the bottom surface of the housing 1080, the housing 1080 supports directly not only the guide member 1091*a*' but also the edge guide member 1091*e*, so that it is possible to more reduce the bending of the base plate 1091 which is caused by a predetermined force such as an external force by the user or external equipment, gravity, reaction by a momentary movement in a particular direction, etc. In other words, the edge guide member 1091*e* can more reinforce the strength of the base plate 1091 than the base plate 1091 shown in FIG. 22. Further, when the end of the edge guide member 1091*e* contacts the bottom surface of the housing 1080, it is possible to more constantly maintain the pressure sensitivity of the touch input device. Further, by the edge guide member 1091*e*, the battery 1060 and the mainboard 1070 can be more stably protected from the external impact.

Meanwhile, though not shown in a separate figure, the structure of the mid-frame 1090 shown in FIGS. 22 to 26 can be applied to the touch input device shown in FIGS. 6 to 15.

Although embodiments of the present invention were described above, these are just examples and do not limit the present invention. Further, the present invention may be changed and modified in various ways, without departing from the essential features of the present invention, by those skilled in the art. For example, the components described in detail in the embodiments of the present invention may be modified. Further, differences due to the modification and application should be construed as being included in the scope and spirit of the present invention, which is described in the accompanying claims.

What is claimed is:

1. A touch input device comprising:
   a mid-frame;
   a cover disposed on the mid-frame;
   a display module disposed between the mid-frame and the cover;
   a battery and a mainboard disposed under the mid-frame; and
   a sensor which is disposed between the mid-frame and the cover and detects at least any one of a touch and a pressure,
      wherein the mid-frame comprises a base plate which comprises a top surface and a bottom surface, wherein the mid-frame comprises a reinforcing member which is disposed on the top surface of the base plate and is configured to reinforce a strength of the base plate,
wherein the reinforcing member protrudes upward from the top surface of the base plate and is integrally formed with the top surface of the base plate,
wherein the mid-frame separates the display module from the battery and the mainboard,
wherein the display module has a display area, and
wherein the reinforcing member is configured to overlap the display area of the display module.

2. The touch input device of claim 1, wherein the mid-frame further comprises a guide member which is disposed on the bottom surface of the base plate and guides the battery and the mainboard, wherein the reinforcing member is disposed on a portion of the top surface of the base plate, and wherein the portion is a back side of a portion where the guide member is not disposed in the bottom surface of the base plate.

3. The touch input device of claim 1, wherein the reinforcing member is attached or coupled to the top surface of the base plate.

4. The touch input device of claim 1, wherein the reinforcing member extends in a direction parallel or perpendicular to a longitudinal direction of the top surface of the base plate and has a predetermined length.

5. The touch input device of claim 1, wherein the reinforcing member is wholly or partially bent.

6. The touch input device of claim 1, wherein a plurality of the reinforcing members are provided, and wherein the plurality of the reinforcing members has any one of a circular plate shape, a polygonal plate shape, and an elliptical plate shape.

7. The touch input device of claim 1, wherein the display module is disposed under the cover, wherein the sensor is a pressure sensor, wherein the pressure sensor is disposed under the display module, and wherein the pressure is detected on the basis of a capacitance which changes according to a change of a distance between the mid-frame and the pressure sensor.

8. The touch input device of claim 7, wherein at least one of a metal cover and an elastic member is disposed between the display module and the pressure sensor.

9. The touch input device of claim 1, wherein the display module is disposed under the cover, wherein a reference potential layer is provided, wherein the sensor is a pressure sensor, wherein the pressure sensor is disposed on the mid-frame, and wherein the pressure is detected on the basis of a capacitance which changes according to a change of a distance between the reference potential layer and the pressure sensor.

10. The touch input device of claim 9, wherein at least one of a metal cover and an elastic member is disposed between the pressure sensor and the mid-frame.

11. The touch input device of claim 1, wherein the display module is disposed under the cover, wherein the sensor is a pressure sensor, wherein the pressure sensor is embedded in the display module, and wherein the pressure is detected on the basis of a capacitance which changes according to a change of a distance between the mid-frame and the pressure sensor.

12. The touch input device of claim 1, wherein the display module is disposed under the cover, wherein the sensor is a touch sensor, and wherein the touch sensor is disposed within the display module.

13. The touch input device of claim 1, wherein the display module comprises at least one of an OLED module and an LCD module having a backlight unit.

14. A touch input device comprising:
a mid-frame;
a cover disposed on the mid-frame;
a display module disposed between the mid-frame and the cover; and
a sensor which is disposed between the mid-frame and the cover and detects at least any one of a touch and a pressure,
wherein the mid-frame comprises a base plate which comprises a top surface and a bottom surface,
wherein the mid-frame comprises a reinforcing member which is disposed on the top surface of the base plate and is configured to reinforce a strength of the base plate,
wherein a plurality of the reinforcing members are provided, and wherein the plurality of the reinforcing members has any one of a circular plate shape, a polygonal plate shape, and an elliptical plate shape,
wherein an interval between two adjacent reinforcing members among the plurality of the reinforcing members becomes smaller toward a central portion of the bottom surface of the base plate.

15. A touch input device comprising:
a housing which receives a battery and a mainboard;
a mid-frame which is disposed within the housing and is disposed on the battery and on the mainboard;
a cover which is disposed on the mid-frame and on the housing;
a display module which is disposed between the mid-frame and the cover; and
a sensor which is disposed between the mid-frame and the cover and detects at least any one of a touch and a pressure,
wherein the mid-frame comprises a base plate which comprises a top surface and a bottom surface,
wherein the mid-frame comprises a guide member which is disposed on the bottom surface of the base plate, is disposed between the battery and the mainboard, and is configured to reinforce a strength of the base plate,
wherein the mid-frame separates the display module from the battery and the mainboard,
wherein the display module has a display area, and
wherein the reinforcing member is configured to overlap the display area of the display module.

16. The touch input device of claim 15, wherein the guide member contacts a bottom surface of the housing.

17. The touch input device of claim 15, wherein the mid-frame further comprises an edge guide member disposed on an edge of the bottom surface of the base plate, and wherein the edge guide member contacts a bottom surface of the housing.

18. The touch input device of claim 15, wherein the bottom surface of the base plate has a predetermined horizontal length and a predetermined vertical length larger than the horizontal length, and wherein the guide member is disposed on a middle portion of the bottom surface of the base plate in a vertically longitudinal direction of the bottom surface of the base plate.

19. The touch input device of claim 15, wherein the bottom surface of the base plate has a predetermined horizontal length and a predetermined vertical length larger than the horizontal length, and wherein the guide member is disposed on a middle portion of the bottom surface of the base plate in a horizontally longitudinal direction of the bottom surface of the base plate.

20. The touch input device of claim 15, wherein the display module is disposed under the cover, wherein the sensor is a pressure sensor, wherein the pressure sensor is disposed under the display module, and wherein the pressure is detected on the basis of a capacitance which changes according to a change of a distance between the mid-frame and the pressure sensor.

21. The touch input device of claim 20, wherein at least one of a metal cover and an elastic member is disposed between the display module and the pressure sensor.

22. The touch input device of claim 15, wherein the display module is disposed under the cover, wherein a reference potential layer is provided, wherein the sensor is a pressure sensor, wherein the pressure sensor is disposed on the mid-frame, and wherein the pressure is detected on the basis of a capacitance which changes according to a change of a distance between the reference potential layer and the pressure sensor.

23. The touch input device of claim 22, wherein at least one of a metal cover and an elastic member is disposed between the pressure sensor and the mid-frame.

24. The touch input device of claim 15, wherein the display module is disposed under the cover, wherein the sensor is a pressure sensor, wherein the pressure sensor is embedded in the display module, and wherein the pressure is detected on the basis of a capacitance which changes according to a change of a distance between the mid-frame and the pressure sensor.

25. The touch input device of claim 15, wherein the display module is disposed under the cover, wherein the sensor is a touch sensor, and wherein the touch sensor is disposed within the display module.

26. The touch input device of claim 15, wherein the display module comprises at least one of an OLED module and an LCD module having a backlight unit.

27. The touch input device of claim 15, wherein the guide member protrudes from the bottom surface of the base plate and is integrally formed with the bottom surface.

\* \* \* \* \*